United States Patent
Hetzel et al.

(10) Patent No.: US 7,721,243 B2
(45) Date of Patent: May 18, 2010

(54) METHOD AND APPARATUS FOR ROUTING

(75) Inventors: Asmus Hetzel, Berlin (DE); Etienne Jacques, Bristol (GB)

(73) Assignee: Cadence Design Systems, Inc., San Jose, CA (US)

(*) Notice: Subject to any disclaimer, the term of this patent is extended or adjusted under 35 U.S.C. 154(b) by 474 days.

(21) Appl. No.: 11/673,429

(22) Filed: Feb. 9, 2007

(65) Prior Publication Data

US 2007/0136713 A1  Jun. 14, 2007

Related U.S. Application Data

(60) Division of application No. 10/751,332, filed on Jan. 2, 2004, now Pat. No. 7,197,738, and a continuation-in-part of application No. 10/215,563, filed on Aug. 9, 2002, now Pat. No. 6,957,408, and a continuation-in-part of application No. 10/215,896, filed on Aug. 9, 2002, now Pat. No. 6,898,773, and a continuation-in-part of application No. 10/229,202, filed on Aug. 26, 2002, now Pat. No. 7,096,449, and a continuation-in-part of application No. 10/229,170, filed on Aug. 26, 2002, now Pat. No. 7,117,468.

(60) Provisional application No. 60/527,443, filed on Dec. 4, 2003.

(51) Int. Cl.
*G06F 17/50* (2006.01)
(52) U.S. Cl. .................. 716/12; 716/11; 716/18
(58) Field of Classification Search .............. 716/11, 716/12, 18
See application file for complete search history.

(56) References Cited

U.S. PATENT DOCUMENTS 5,822,214 A  10/1998  Rostoker et al.

(Continued)

OTHER PUBLICATIONS

U.S. Appl. No. 11/195,334, filed Aug. 1, 2005, Ylinen, Judd, et al.

(Continued)

*Primary Examiner*—Thuan Do
(74) *Attorney, Agent, or Firm*—Adeli & Tollen LLP

(57) ABSTRACT

Some embodiments of the invention provide a router that can define a route that has different widths along different directions on the same layer. To facilitate the creation of such a route, some embodiments adaptively define the shape of interconnect-line ends (i.e., the shape of route-segment ends) on a particular layer based on the routing directions available on the particular layer. By so defining these shapes, these embodiments improve the alignment of route segments that have differing widths. In other words, dynamically defining the interconnect-line ends improves the shape of a route at bends along which the route transition from one width to another. Also, to facilitate the creation of a route with different widths and/or spacing in different directions on a particular layer, some embodiments define, for each available routing direction on the particular layer, an "unroutable" bloated region about a previously defined geometry (e.g., a previously defined obstacle, wire, or via pad) on the particular layer. An item's bloated region for a particular routing direction specifies the portion of the particular layer that is not available for route segments along the particular routing direction. As further described below, the item's bloated region for a particular direction is derived based on the minimum spacing required between the item and any route segment in the particular direction for the particular net.

26 Claims, 12 Drawing Sheets

U.S. PATENT DOCUMENTS

| | | | |
|---|---|---|---|
| 5,994,766 | A | 11/1999 | Shenoy et al. |
| 6,256,769 | B1 | 7/2001 | Tamarkin et al. |
| 6,262,487 | B1 | 7/2001 | Igarashi et al. |
| 6,385,758 | B1 | 5/2002 | Kikuchi et al. |
| 6,483,714 | B1 | 11/2002 | Kabumoto et al. |
| 6,490,713 | B2 | 12/2002 | Matsumoto |
| 6,553,555 | B1 | 4/2003 | Green et al. |
| 6,609,237 | B1 | 8/2003 | Hamawaki et al. |
| 6,618,846 | B2 | 9/2003 | Cheng |
| 6,645,842 | B2 | 11/2003 | Igarashi et al. |
| 6,678,876 | B2 | 1/2004 | Stevens et al. |
| 6,734,472 | B2 | 5/2004 | Ho |
| 6,763,508 | B2 | 7/2004 | Igarashi et al. |
| 6,802,048 | B2 | 10/2004 | Goto et al. |
| 6,879,934 | B1 | 4/2005 | Teig et al. |
| 6,938,230 | B2 | 8/2005 | Frank et al. |
| 6,976,237 | B1 | 12/2005 | Teig et al. |
| 6,977,440 | B2 | 12/2005 | Pflughaupt et al. |
| 6,988,162 | B2 | 1/2006 | Goergen |
| 6,996,793 | B1 | 2/2006 | Kronmiller et al. |
| 7,002,572 | B1 | 2/2006 | Teig et al. |
| 7,065,729 | B1 * | 6/2006 | Chapman ..................... 716/13 |
| 7,065,731 | B2 | 6/2006 | Jacques et al. |
| 7,080,339 | B2 * | 7/2006 | Jacques et al. ................ 716/12 |
| 7,117,470 | B1 | 10/2006 | Teig et al. |
| 7,174,529 | B1 | 2/2007 | Hetzel |
| 7,197,738 | B1 | 3/2007 | Hetzel et al. |
| 7,472,366 | B1 | 12/2008 | Hetzel et al. |
| 2002/0114224 | A1 | 8/2002 | Sasaki et al. |
| 2003/0009736 | A1 * | 1/2003 | Suto .............................. 716/8 |
| 2003/0126582 | A1 | 7/2003 | Kobayashi et al. |
| 2003/0192019 | A1 | 10/2003 | Goto et al. |
| 2004/0049754 | A1 | 3/2004 | Liao et al. |
| 2004/0098688 | A1 | 5/2004 | Vuong et al. |
| 2004/0098697 | A1 | 5/2004 | Frankle et al. |
| 2004/0145033 | A1 | 7/2004 | McElvain |
| 2004/0225990 | A1 | 11/2004 | Jacques et al. |
| 2005/0044520 | A1 | 2/2005 | Vuong et al. |
| 2005/0098895 | A1 | 5/2005 | Hung |
| 2005/0172247 | A1 | 8/2005 | Papadopoulou et al. |
| 2005/0223348 | A1 | 10/2005 | Frank et al. |
| 2005/0235246 | A1 | 10/2005 | Smith et al. |
| 2005/0273744 | A1 | 12/2005 | Allen et al. |
| 2009/0089735 | A1 | 4/2009 | Hetzel et al. |

OTHER PUBLICATIONS

Restriction Requirement of U.S. Appl. No. 10/751,332, Mar. 23, 2006 (mailing date), Hetzel, Asmus, et al.

Non-Final Office Action of U.S. Appl. No. 10/751,332, Jul. 17, 2006 (mailing date), Hetzel, Asmus, et al.

Notice of Allowance of U.S. Appl. No. 10/751,332, Nov. 9, 2006 (mailing date), Hetzel, Asmus, et al.

Restriction Requirement of U.S. Appl. No. 11/195,334, Sep. 25, 2006 (mailing date), Ylinen, Judd, et al.

Non-Final Office Action of U.S. Appl. No. 11/195,334, Nov. 20, 2006 (mailing date), Ylinen, Judd, et al.

Final Office Action and Restriction Requirement of U.S. Appl. No. 11/195,334, May 11, 2007 (mailing date), Ylinen, Judd, et al.

Advisory Action of U.S. Appl. No. 11/195,334, Jul. 31, 2007 (mailing date), Ylinen, Judd, et al.

Non-Final Office Action of U.S. Appl. No. 11/195,334, Apr. 9, 2008 (mailing date), Ylinen, Judd, et al.

U.S. Appl. No. 11/076,204, filed Mar. 9, 2005, Ylinen, et al.

Restriction Requirement of U.S. Appl. No. 11/076,204, Oct. 30, 2006 (mailing date), Ylinen, et al.

Non-Final Office Action of U.S. Appl. No. 11/076,204, Jan. 30, 2007 (mailing date), Ylinen, et al.

Final Office Action of U.S. Appl. No. 11/076,204, Sep. 17, 2007 (mailing date), Ylinen, et al.

Advisory Action of U.S. Appl. No. 11/076,204, Dec. 11, 2007 (mailing date), Ylinen, et al.

Non-Final Office Action of U.S. Appl. No. 11/076,204, May 15, 2008 (mailing date), Ylinen, et al.

U.S. Appl. No. 12/471,350, filed May 22, 2009, Ylinen, Judd M., et al.

Non-Final Office Action of U.S. Appl. No. 10/779,954, Mar. 31, 2006 (mailing date), Hetzel, Asmus G.

Notice of Allowance of U.S. Appl. No. 10/779,954, Sep. 27, 2006 (mailing date), Hetzel, Asmus G.

Notice of Allowance of U.S. Appl. No. 11/076,204, Feb. 23, 2009 (mailing date), Ylinen, Judd M., et al.

Restriction Requirement of U.S. Appl. No. 11/076,204, Nov. 13, 2008 (mailing date), Ylinen, Judd M., et al.

Non-Final Office Action of U.S. Appl. No. 11/195,335, May 18, 2007 (mailing date), Hetzel, Asmus, et al.

Notice of Allowance of U.S. Appl. No. 11/195,335, Aug. 21, 2008 (mailing date), Hetzel, Asmus, et al.

Advisory Action of U.S. Appl. No. 11/195,334, May 15, 2009 (mailing date), Ylinen, Judd M., et al.

Final Office Action of U.S. Appl. No. 11/195,334, Nov. 28, 2008 (mailing date), Ylinen, Judd M., et al.

NB8911253, "Polygonal Expansion Algorithm", Nov. 1, 1989, vol. No. 32, Issue No. 6B, pp. 253-264.

* cited by examiner

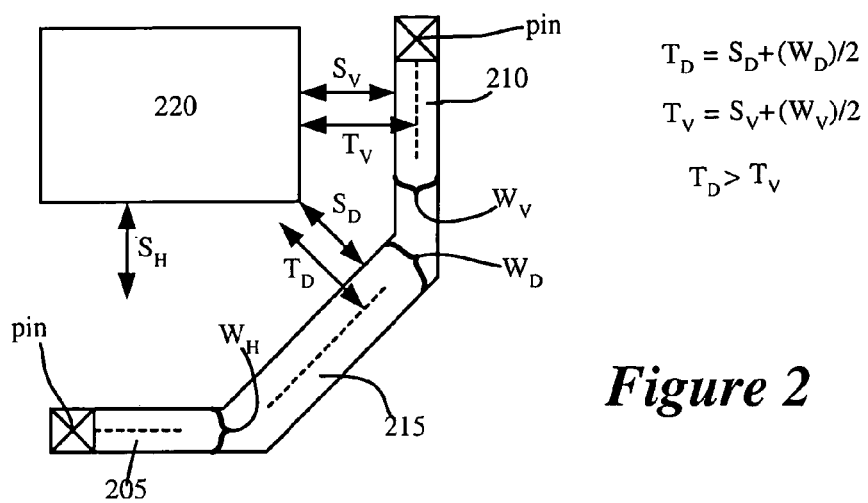
*Figure 1*
*Figure 2*
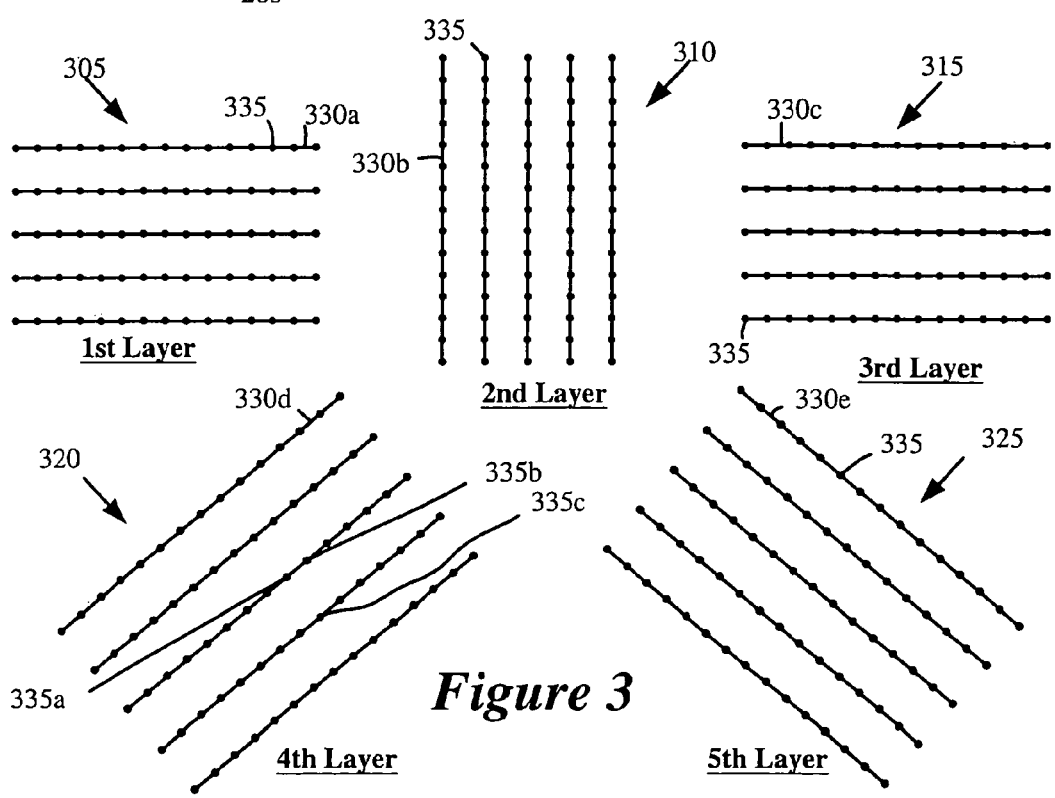
*Figure 3*

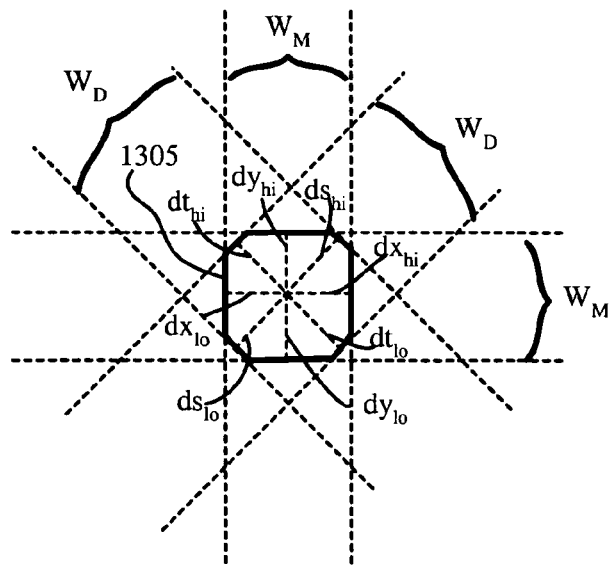
Figure 13
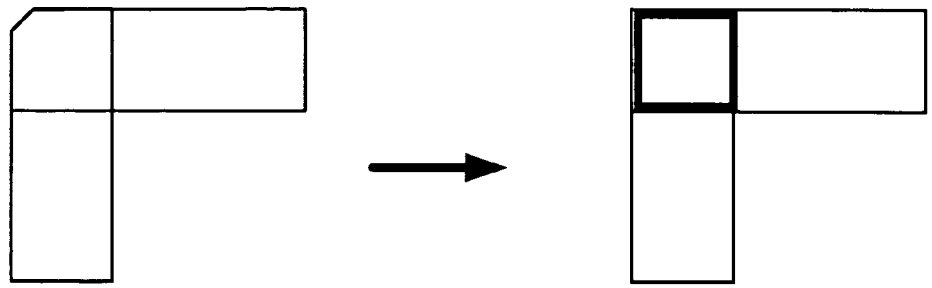
Undesirable  Figure 17  Replacement
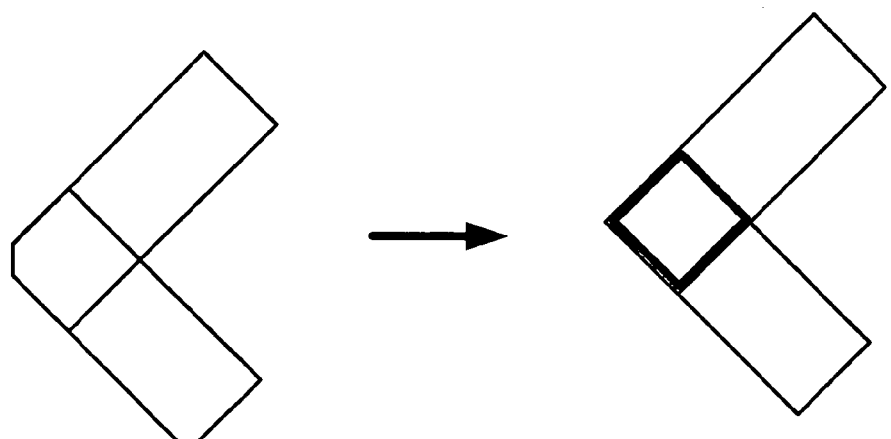
Undesirable  Figure 18  Replacement

METHOD AND APPARATUS FOR ROUTING

CLAIM OF BENEFIT TO PRIOR APPLICATIONS

This application is a divisional patent application of U.S. patent application Ser. No. 10/751,332, filed on Jan. 2, 2004 now U.S. Pat. No. 7,197,738, which claims benefit to U.S. Provisional Patent Application 60/527,443, filed on Dec. 4, 2003. U.S. patent application Ser. No. 10/751,332 and U.S. Provisional Patent Application 60/527,443 are incorporated herein by reference. This application is also a continuation-in-part of U.S. patent application Ser. No. 10/215,563, filed on Aug. 9, 2002 now U.S. Pat. No. 6,957,408; U.S. patent application Ser. No. 10/215,896, filed on Aug. 9, 2002 now U.S. Pat. No. 6,898,773; U.S. patent application Ser. No. 10/229,202 now U.S. Pat. No. 7,096,449, filed on Aug. 26, 2002, and U.S. patent application Ser. No. 10/229,170, filed on Aug. 26, 2002 now U.S. Pat. No. 7,117,468.

FIELD OF THE INVENTION

The present invention is directed towards method and apparatus for routing.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, ICs use preferred direction ("PD") wiring models, which specify a preferred wiring direction for each of their wiring layers. In preferred direction wiring models, the preferred direction typically alternates between successive wiring layers. One example of a PD wiring model is the PD Manhattan wiring model, which specifies alternating layers of preferred-direction horizontal and vertical wiring.

Design engineers design ICs by transforming logical or circuit descriptions of the ICs into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. A list of all or some of the nets in a layout is referred to as a net list.

To create layouts, design engineers typically use electronic design automation ("EDA") applications. These applications provide sets of computer-based tools for creating, editing, and analyzing IC design layouts. One EDA tool is a router that defines routes for interconnect lines that typically connected the pins of nets. While some commercial routers today might allow an occasional diagonal jog, these routers do not typically explore diagonal routing directions consistently when they are specifying the routing geometries of the interconnect lines. This, in turn, increases the total wirelength (i.e., total length of interconnect lines) needed to connect the nets in the layout.

Recently, some have suggested routers that explore Manhattan and diagonal directions. These routers typically use the same with and spacing requirements for routes in Manhattan and diagonal directions. However, there are certain advantages to having different spacing and width requirements for routes in Manhattan and diagonal directions. Therefore, there is a need for a routing method and apparatus that not only considers diagonal routing directions but also supports different spacing and/or with constrains for different routing directions.

SUMMARY OF THE INVENTION

Some embodiments of the invention provide a router that routes a set of nets in a region of a multi-layer, integrated circuit ("IC") layout. In some embodiments, the router defines routes for nets in the multi-layer IC layout. For a particular net, the method specifies different widths and/or spacing for routing the particular net in different directions on the same layer. It then defines a particular route for the particular net, where the route has different widths and/or spacing in the different directions on the same layer.

To facilitate the creation of routes with different widths in different directions on the same layer, some embodiments adaptively define the shape of interconnect-line ends (i.e., the shape of route-segment ends) on a particular layer based on the routing directions available on the particular layer. By so defining these shapes, these embodiments improve the alignment of route segments that have differing widths. In other words, dynamically defining the interconnect-line ends improves the shape of a route at bends along which the route transition from one width to another.

Also, to facilitate the creation of routes with different widths and/or spacing in different directions on a particular layer, some embodiments define, for each available routing direction on the particular layer, an "unroutable" bloated region about a previously defined geometry (e.g., a previously defined obstacle, wire, or via pad) on the particular layer. An item's bloated region for a particular routing direction specifies the portion of the particular layer that is not available for route segments along the particular routing direction. As further described below, the item's bloated region for a particular direction is derived based on the minimum spacing required between the item and any route segment in the particular direction for the particular net.

BRIEF DESCRIPTION OF THE DRAWINGS

The novel features of the invention are set forth in the appended claims. However, for purpose of explanation, several embodiments of the invention are set forth in the following figures.

FIG. 1 illustrates a five-layer wiring model.

FIG. 2 provides an example of a detailed route for a particular two-pin net.

FIG. 3 illustrates five routing grids for the five-layer wiring model of FIG. 1.

FIGS. 13-15 illustrate an example of adaptively defining interconnect-line ends for a layer that can be routed along horizontal, vertical, and ±45° directions.

FIGS. 17 and 18 illustrate examples of undesirable shapes that might occur at certain bends.

DETAILED DESCRIPTION OF THE INVENTION

Figure 4:
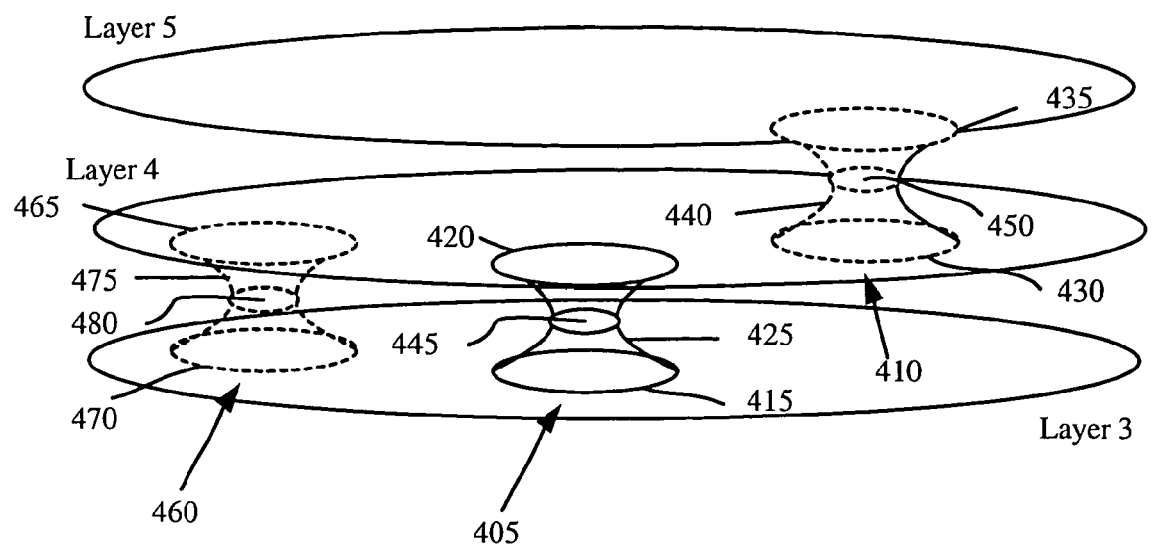
FIG. 4 illustrates three vias.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Several embodiments of the invention provide a router that routes a set of nets in a region of a multi-layer, integrated circuit ("IC") layout. In some embodiments, the router defines routes for nets in the multi-layer IC layout. For a particular net, the method specifies different widths and/or spacing for routing the particular net in different directions on the same layer. It then defines a particular route for the particular net, where the route has different widths and/or spacing in the different directions on the same layer.

The embodiments described below employ two techniques in order to facilitate the creation of routes with different widths and/or spacing in different directions on the same layer. First, these embodiments adaptively define the shape of interconnect-line ends (i.e., the shape of route-segment ends) on a particular layer based on the routing directions available on the particular layer. By so defining these shapes, these embodiments improve the alignment of route segments that have differing widths. In other words, dynamically defining the interconnect-line ends improves the shape of a route at bends along which the route transition from one width to another.

Second, to route a particular net on a particular layer that has two or more available routing directions, these embodiments define, for each available routing direction, an "unroutable" bloated region about a previously defined geometry (e.g., a previously defined obstacle, wire, or via pad) on the particular layer. An item's bloated region for a particular routing direction specifies the portion of the particular layer that is not available for route segments along the particular routing direction. As further described below, the item's bloated region for a particular direction is derived based on the minimum spacing required between the item and any route segment in the particular direction for the particular net.

Before describing the two approaches mentioned above, several terms and concepts are defined below in Section I. Section II then describes adaptively defining the shape of interconnect-line ends for a particular layer with two or more routing directions. Section III then describes defining and using two or more bloated regions about a design-layout item for two or more routing directions that are available on the item's layer.

I. Terms and Concepts

A detailed router defines detailed routes for nets in an IC layout. Each net includes a set of routable elements in the IC-layout region. The routable elements are pins in the embodiments described below, although they might be other elements in other embodiments. In some embodiments, the router uses a five-layer wiring model that is illustrated in FIG. 1. As shown in this figure, this wiring model has horizontal wiring on wiring layer 1, vertical wiring on wiring layer 2, horizontal wiring on wiring layer 3, +45° diagonal wiring on wiring layer 4, and −45° diagonal wiring on wiring layer 5. One of ordinary skill will realize that the router can use other wiring models in other embodiments. In some embodiments, an interconnect line is "horizontal" or "vertical" if it forms an angle of 0° or 90° with respect to one of the coordinate axes of the layout. On the other hand, a line is "diagonal" if it forms an angle other than 0° or 90° with respect to the layout's Cartesian coordinate axes, which are typically parallel with the layout's boundary and/or the boundary of the layout's expected IC. For instance, in some embodiments, a 45° diagonal line is one that is at 45° (in the counterclockwise direction) with respect to the x-axis, while a −45° diagonal line is one that is at −45° (in the counterclockwise direction) with respect to the x-axis.

In the embodiments below, the horizontal, vertical, and ±45° routing directions are available on each wiring layer. (However, as further described below, each layer has one preferred routing direction.) The four routing directions on each layer provide eight possible directions (called segment directions) for a route to traverse from any point on a layer. These segment directions are 0°, 45°, 90°, 135°, 180°, 225°, 270°, and 315°.

A route has one or more route segments. A route segment is a portion of a route that is straight and is along a particular routing direction. In this document, the phrase "interconnect line" is synonymous with "route segment," and the two phrases are often used interchangeably. FIG. 2 provides an example of a detailed route 200 for a particular two-pin net. This route connects the two pins of the net. As shown in FIG. 2, the route 200 has different segments with different widths and spacing constraints. Specifically, this route has three segments 205, 210, and 215. Segments 205 and 210 are Manhattan segments (are a horizontal segment and a vertical segment) that have widths $W_H$ and $W_V$. In this example, both these widths are equal and hence can be represented as $W_M$. However, these two Manhattan widths could be different in other examples. Segment 215 is a 45° diagonal segment that has a width $W_D$, which is different that the width $W_M$.

As shown in FIG. 2, the route 200 passes by an item 220 in the layout. FIG. 2 illustrates three minimum spacing requirements $S_H$, $S_V$, and $S_D$, which respectively define the minimum spacing between the item 220 and horizontal route segments, vertical route segments, and +45° route segments for the two-pin net. In this example, the minimum spacing requirements $S_H$ and $S_V$ are the same. However, these two spacing requirements could be different in other examples. In this example, the spacing requirement $S_D$ is different than the spacing requirements $S_H$ and $S_V$, although it could be the same as one or both of them in other examples. To define a route for a net, some embodiments of the invention define a minimum total spacing constraint between an item in the layout and each available routing direction. As shown in FIG. 2, a minimum total spacing requirement for a particular direction (e.g., the +45° direction) equals the minimum spacing requirement along that direction (e.g., $S_D$) plus half of the width of the route segment along that direction (e.g., $W_D/2$).

To route a set of nets, the embodiments described below first define a routing graph that includes a routing grid for each routing layer. As illustrated in FIG. 1, each routing layer has a preferred routing direction in some embodiments. In some of these embodiments, each routing grid of each particular routing layer includes numerous routing tracks that are in the preferred routing direction of the particular routing layer. For instance, FIG. 3 illustrates five routing grids 305-325 for the five-layer wiring model of FIG. 1. Each of these routing grids includes numerous tracks 330 that are in the preferred routing direction of their layer. For example, the routing grid 320 for the fourth layer has numerous tracks 330d that are in the +45° preferred routing direction of the fourth layer in the five-layer model of FIG. 1.

Each track is formed by numerous edges that connect numerous grid points 335 along the track. The router is said to be a "gridded" router when the grid points in the routing graph (i.e., the grid points in all the routing grids) do not include all the grid points of the manufacturing grid, which is the grid used by the IC manufacturing process. On the other hand, the router is said to be "gridless" when its routable states (e.g., its grid points, nodes, lines, surfaces, etc.) are not aligned with any arbitrary routing grid. The routable states of a gridless router are typically aligned with the grid of the manufacturing process (i.e., typically each point on the manufacturing grid is a routable state in one of the routing grids), so that the final layout can be easily manufactured. However, in certain instances, the gridless routers might not even be aligned with the manufacturing grid. In some cases, the gridless routers are aligned with a grid that is even finer (i.e., has a higher resolution) than the manufacturing grid.

The grid points along the tracks serve as the start, intermediate, termination, and bend points of routes. On a particular layer, a route segment can go from a first grid point on a first track to a second adjacent grid point on a second track (i.e., a route can have a segment that traverses the particular layer in a direction that is not the preferred direction of the particular layer), but such a route segment is assessed a cost that is greater than a segment that connects two adjacent grid points along the same track. This differential in costing is what makes the directions illustrated in FIG. 3 preferred directions. In other words, the directions of the tracks illustrated in FIG. 3 are preferred directions of their layers because routing along these directions is less costly than routing along other directions on these layers. For instance, on the fourth layer, a route segment that connects two adjacent grid points 335a and 335b costs less than a route segment that connects the two adjacent grid points 335a and 335c.

In the embodiments described below, a route can traverse multiple layers. Such a route is a multi-layer route. A multi-layer route uses at least one non-planar segment to traverse from one layer to another. This non-planar segment is called a via. In some embodiments, a via includes (1) one pad on each of the two layers that it traverses and (2) a cut that is the three-dimensional hole between the two layers. FIG. 4 illustrates three vias, a first via 405 that is between wiring layers 3 and 4, a second via 410 that is between wiring layers 4 and 5, and a third via 460 that is between wiring layers 3 and 4. Via 405 has pad 415 on layer 3, pad 420 on layer 4, and cut 425 between layers 3 and 4. Via 410 has pad 430 on layer 4, pad 435 on layer 5, and cut 440 between layers 4 and 5. Via 460 has pad 470 on layer 3, pad 465 on layer 4, and cut 475 between layers 3 and 4.

Figure 5:
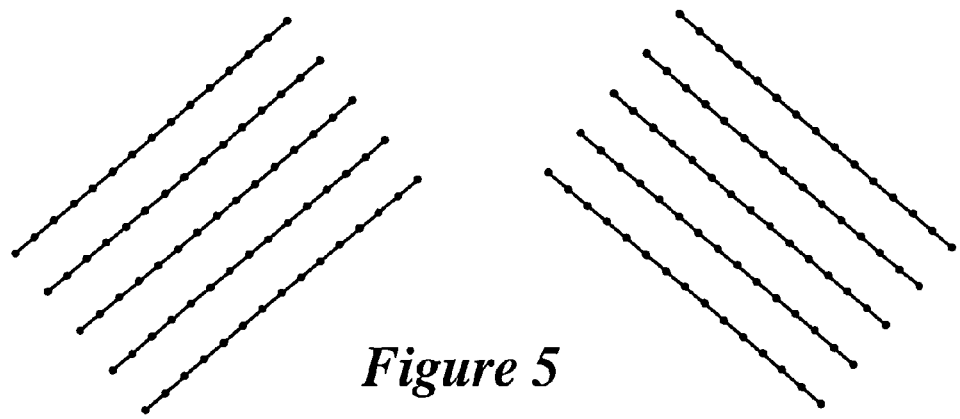
FIG. 5 illustrates two cut planes that are used for defining vias between the fourth and fifth layers of the routing model illustrated in FIGS. 1 and 3.

To account for vias between each pair of adjacent layers, the routing graph of some embodiments described below includes two cut planes for each pair of adjacent layers, where one cut plane mirrors the tracks on one layer and the other cut plane mirrors the tracks on the other layer. For instance, FIG. 5 illustrates the two cut planes that are used for defining vias between the fourth and fifth layers 320 and 325 of the routing model illustrated in FIGS. 1 and 3. As further described below, some embodiments use the cut planes to mark up the regions in the layout that are not available for via transitions. Two cut planes are used between each two adjacent layers in order to simplify the mapping of blocked unroutable areas from the layers onto the via cut planes.

In the description below, the term geometry or geometries refers to previously defined items in the layout that have to be considered while routing a net. Such previously defined items include obstacles as well as previously defined routes, which have planar route segments and vias (i.e., via pads and cuts).

Figure 6:
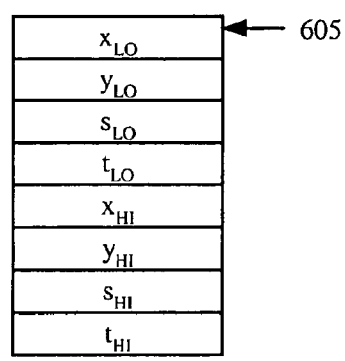
FIG. 6 illustrates an octangle data structure.
Figure 7:
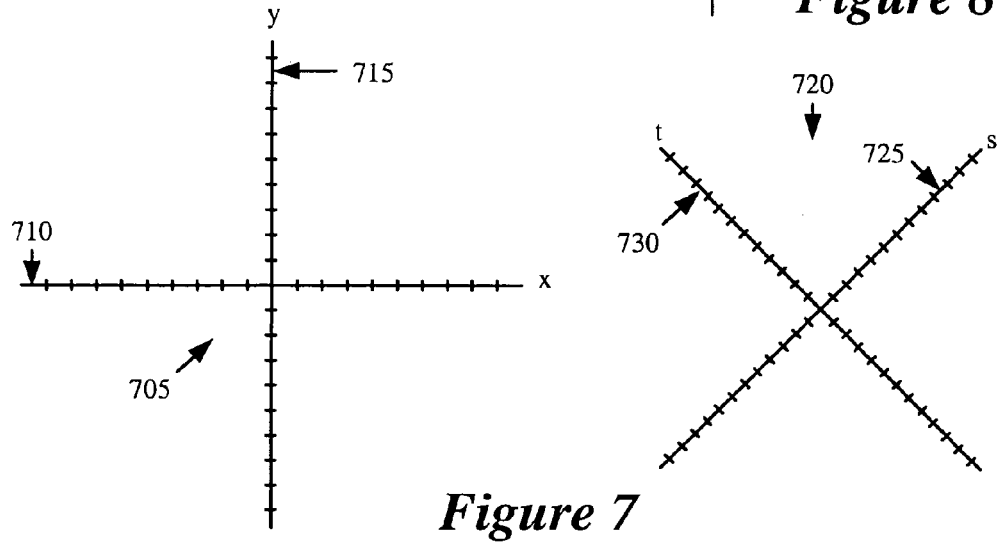
FIG. 7 illustrates two coordinate systems.

Some embodiments that use the wiring model illustrated in FIG. 1 represent each planar item in the layout in terms of one or more convex polygonal shape, and represent each convex polygonal shape by using a particular data structure, called an octangle. As illustrated in FIG. 6, the octangle data structure 605 represents each convex geometric shape in terms of eight values, $x_{LO}$, $y_{LO}$, $s_{LO}$, $t_{LO}$, $x_{HI}$, $y_{HI}$, $s_{HI}$, and $t_{HI}$. These eight values define eight half plane in two coordinate systems, which are illustrated in FIG. 7. As shown in FIG. 7, one coordinate system is a Manhattan coordinate system 705, which is formed by an x-axis 710 and y-axis 715. The other coordinate system is a 45°-rotated coordinate system 720, which is formed by an s-axis 725 and t-axis 730. The s-axis is at a 45° counterclockwise rotation from the x-axis 710, while the t-axis is at a 135° counterclockwise rotation from the x-axis 710. In the layouts of some embodiments, horizontal lines are aligned with the x-axis, vertical lines are aligned with the y-axis, 45° diagonal lines are aligned with the s-axis, and −45° diagonal lines are aligned with the t-axis.

In some embodiments, the Manhattan coordinate system is aligned with the manufacturing grid. Also, some embodiments define the unit length along the s- and t-axes to be $$\frac{\sqrt{2}}{2}$$

times the unit length along the x- and y-axes, so that the diagonal coordinate system is also aligned with manufacturing grid. In other words, the coordinate resolution along the diagonal coordinate system 720 is selected such that diagonal lines that traverse through integer diagonal coordinates can start and terminate on the manufacturing grid, and can intersect, on the manufacturing grid, the Manhattan lines that traverse through integer Manhattan coordinates.

As mentioned above, the octangle data structure 605 represents each convex geometric shape in terms of 8 values, where each value defines a half plane that is defined in the design layout by reference to one of the two coordinate systems 705 and 720. FIG. 6 identifies these 8 values as $x_{LO}$, $y_{LO}$, $s_{LO}$, $t_{LO}$, $x_{HI}$, $y_{HI}$, $s_{HI}$, and $t_{HI}$. The values $x_{LO}$, $y_{LO}$, $s_{LO}$, $t_{LO}$ are the smallest coordinates of the shape along the x-, y-, s-, and t-axes (i.e., the smallest x-, y-, s-, and t-axis values of the shape), while $x_{HI}$, $y_{HI}$, $s_{HI}$, and $t_{HI}$ are the largest coordinates of the shape along the x-, y-, s-, and t-axes (i.e., the largest x-, y-, s-, and t-axis values of the shape). The intersection of these 8 half-planes defines a convex geometric shape. Specifically, the eight values $X_{LO}$, $y_{LO}$, $s_{LO}$, $t_{LO}$, $x_{HI}$, $y_{HI}$, $s_{HI}$, and $t_{HI}$ define a convex geometric shape $$S(x, y) \in R^2$$

where:

$$x_{LO} \leq x \leq x_{HI},$$

$$y_{LO} \leq y \leq y_{HI},$$

$$s_{LO} \leq s \leq s_{HI},$$

$$t_{LO} \leq t \leq t_{HI},$$

$$s = x+y, \text{ and}$$

$$t = y-x.$$

Figure 8:
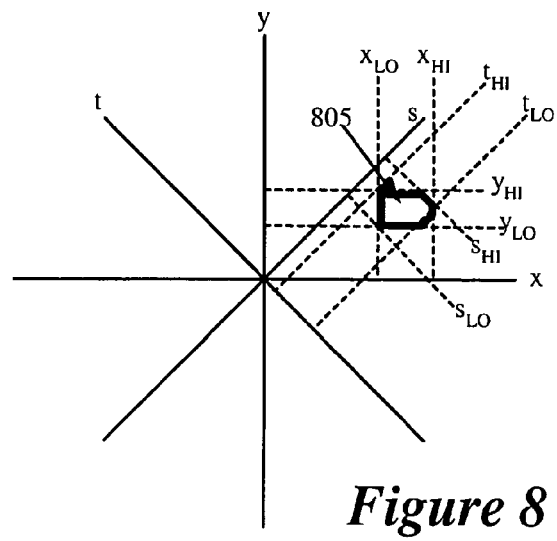
FIG. 8 provides one example that illustrates how eight values define a convex polygon.

FIG. 8 provides one example that illustrates how the eight values, $x_{LO}$, $y_{LO}$, $s_{LO}$, $t_{LO}$, $x_{HI}$, $y_{HI}$, $s_{HI}$, and $t_{HI}$, define a convex polygon 805. Octangles are further described in U.S. patent application Ser. No. 10/443,595, now issued U.S. Pat. No. 7,243,328, filed May 21, 2003, which is incorporated herein by reference. The application Ser. No. 10/443,595 also describes several operations (such as octangle expansions, reductions, intersections, unioning, etc.) that can be performed on octangles. Some of these operations (such as expansions, reductions, intersections, etc.) include a canonicalization step that ensures that any superfluous half plane of an octangle resulting from the operation abuts one of the vertices of the polygon defined by the octangle. This canonical definition is part of the above-mentioned definition of the eight half-plane values $x_{LO}$, $y_{LO}$, $s_{LO}$, $t_{LO}$, $x_{HI}$, $y_{HI}$, $s_{HI}$, and $t_{HI}$. As mentioned above, the values $x_{LO}$, $y_{LO}$, $s_{LO}$, $t_{LO}$ are defined as the smallest coordinates of the shape along the x-, y-, s-, and t-axes (i.e., the smallest x-, y-, s-, and t-axis values of the shape), while $X_{HI}$, $Y_{HI}$, $S_{HI}$, and $t_{HI}$ are defined as the largest coordinates of the shape along the x-, y-, s-, and t-axes (i.e., the largest x-, y-, s-, and t-axis values of the shape). In the embodiments described below, the canonicalization operation is performed with each expansion, reduction, or intersection operation. These operations and their canonicalization operation are further described in the above-incorporated application Ser. No. 10/443,595.

Some embodiments define each route in terms of one or more "line segments" and one "style" for each segment. Each line segment is defined in terms of a start point and an end point. A style specifies eight values that can be used to transform the line-representation of a line segment into a convex polygonal shape that represents the "route segment," which is the more complete geometric representation of the segment. These eight values include four low values, $dx_{LO}$, $dy_{LO}$, $ds_{LO}$, $dt_{LO}$, and four high values, $dx_{HI}$, $dy_{HI}$, $ds_{HI}$, and $dt_{HI}$. The low values are subtracted from the lowest x-, y-, s- and t-values of the line segment's start and end points, in order to obtain the low values of convex polygon (i.e., the route segment) that represents the line segment. On the other hand, the high values are added to the highest x-, y-, s-, and t-values of the line segment's start and end points to obtain the high values of the convex polygon.

Figure 9:
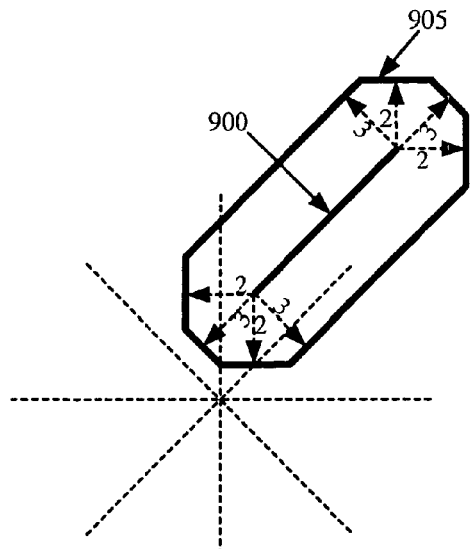
FIGS. 9 and 10 illustrate the use of two different styles for the same line segment.
Figure 10:
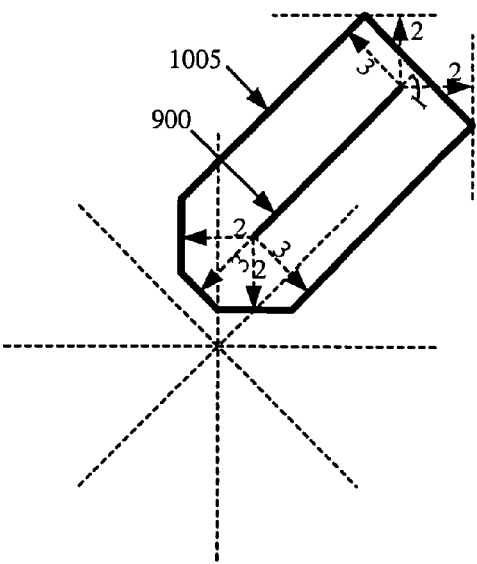

FIGS. 9 and 10 illustrate the use of two different styles for the same line segment 900. The line segment 900 connects the x,y coordinates (1,3) and (5,7), which map to the s,t coordinates (4,2) and (12,2). In the example illustrated in FIG. 9, the style is specified by the following eight values:

$$dx_{LO}=2, dy_{LO}=2, ds_{LO}=3, dt_{LO}=3, dx_{HI}=2, dy_{HI}=2,$$
$$ds_{HI}=3, dt_{HI}=3.$$

FIG. 9 illustrates that the subtraction of the style's low values from the corresponding low values of the line segment 900 identifies the following four half-planes:

$$x_{LO}=-1, y_{LO}=1, s_{LO}=1, t_{LO}=-1,$$

while the addition of the style's high values from the corresponding high values of the line segment 900 identifies the following four half-planes:

$$x_{HI}=7, y_{HI}=9, s_{HI}=15, t_{HI}=5.$$

As shown in FIG. 9, these eight half planes define an octagon 905. In the example illustrated in FIG. 10, the style is specified by the following eight values:

$$dx_{LO}=2, dy_{LO}=2, ds_{LO}=3, dt_{LO}=3, dx_{HI}=2, dy_{HI}=2,$$
$$ds_{HI}=1, dt_{HI}=3.$$

FIG. 10 illustrates that the subtraction of the style's low values from the corresponding low values of the line segment 900 identifies the following four half-planes:

$$x_{LO}=-1, y_{LO}=1, s_{LO}=1, t_{LO}=-1,$$

while the addition of the style's high values from the corresponding high values of the line segment 900 identifies the following four half-planes:

$$x_{HI}=7, y_{HI}=9, s_{HI}=13, t_{HI}=5.$$

As shown in FIG. 10, these eight half planes define a hexagon 1005. Accordingly, in the example illustrated in FIGS. 9 and 10, the use of two different styles for the same line segment 900 resulted in two different convex polygonal shapes 905 and 1005 for the line segment. Styles are further described in the above-incorporated patent application Ser. No. 10/443, 595. As mentioned in that application, some embodiments run-length encode the line segments of a route.

The description below also refers to DRC violations. DRC stands for design rule check. A layout design often has to comport with a variety of design rules, such as appropriate spacing between particular nets and particular nets and particular geometries. A DRC violation occurs when a design violates a design rule.

II. Adaptively Defining Shape of Interconnect-Line Ends

In order to facilitate the creation of routes with different widths and/or spacing in different directions on the same layer, some embodiments adaptively define the shape at the ends of route segments on a particular layer based on the routing directions available on the particular layer. By so defining these shapes, these embodiments improve the alignment of route segments that have differing widths.

Figure 11A:
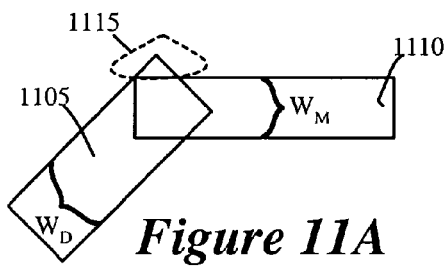
FIGS. 11A-11B presents an example that illustrates the need for adaptively defining the shape of interconnect-line ends.
Figure 11B:
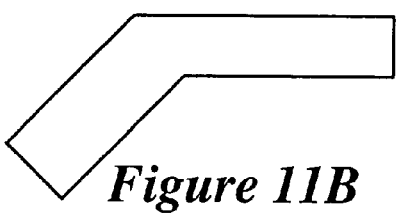

FIGS. 11-11B presents an example that illustrates the need for adaptively defining the shape of interconnect-line ends. Specifically, FIG. 11A illustrates a portion of a route that includes two overlapping rectangular route segments 1105 and 1110 on the same layer of an IC layout. Segment 1105 is in a 45° direction, while segment 1110 is in a horizontal direction. Also, segment 1105 has a width $W_D$, which is larger than the width $W_M$ of segment 1110.

Figure 12:
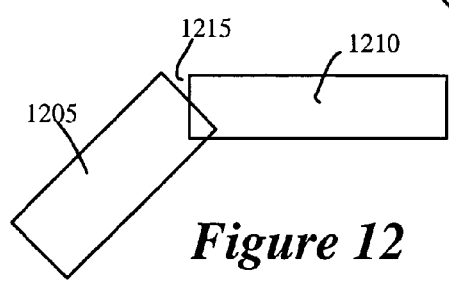
FIG. 12 presents another example that illustrates the need for adaptively defining the shape of interconnect-line ends.

These two segments poorly align at their overlap as they are rectangles and as one segment is wider than the other. In other words, the route's bend at the overlap of these two segments has a protrusion 1115 that will be hard to manufacture. This protrusion 1115 has to be cut or extended to facilitate the process for generating the mask for the layout. Extension of this protrusion, in turn, might have its own undesirable effects, such as DRC violations. Alternatively, cutting this protrusion will result in a smooth bend as illustrated in FIG. 11B, but this cutting will require additional processing FIG. 12 presents another example that illustrates the need for adaptively defining the shape of interconnect-line ends. It illustrates a portion of a route that includes two overlapping rectangular segments 1205 and 1210 on the same layer of an IC layout. Like segments 1105 and 1110, segments 1205 and 1210 are respectively in a 45° direction and a horizontal direction, with the segment 1205 having the larger width. Unlike segments 1105 and 1110, the overlap of segments 1205 and 1210 does not result in a protrusion but rather results in a notch 1215. Like the protrusion 1115, notch 1215 has undesirable physical and electrical characteristics. These characteristics can be avoided by extending one of the segments or by filling the notch. However, extending one of the segments and filling the notch might have their own undesirable effects, such as DRC violations, additional processing requirement, etc.

Figure 14:
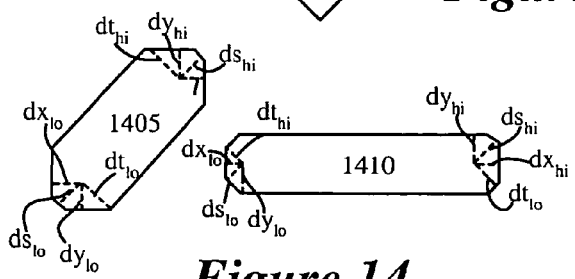
Figure 15:
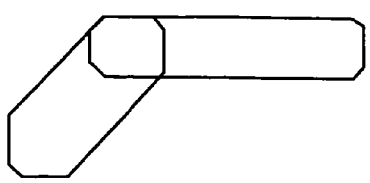

Accordingly, to improve the shape of route at bends (e.g., at bends along which the route transition from one width to another) on a particular layer, some embodiments adaptively define the interconnect-line ends based on the width of the routes along the routing directions available on the particular layer. FIGS. 13-15 illustrate an example of adaptively defining interconnect-line ends for a layer that can be routed along horizontal, vertical, and ±45° directions. In this example, the width of route segments along the Manhattan directions is $W_M$, while the width of route segments along the diagonal directions is $W_D$.

FIG. 13 illustrates the intersection of route segments along the horizontal, vertical, and ±45° directions. This intersection results in an octagon 1305 that can then be used to define the shape at the end of the route segments. Specifically, the octagon 1305 is specified by eight values $dx_{LO}$, $dy_{LO}$, $ds_{LO}$, $dt_{LO}$, $dx_{HI}$, $dy_{HI}$, $ds_{HI}$, and $dt_{HI}$, each of which defines a half-plane that bounds the octagon. These eight values can then be used as the eight values that define the style of the route segments in the horizontal, vertical, and ±45° directions on the particular layer. For instance, FIG. 14 illustrates route segments 1405 and 1410 that are identical to the route segments 1105 and 1110 of FIG. 11, except that segments 1405 and 1410 have different shaped ends than segments 1105 and 1110. Segments 1405 and 1410 have the hemi-octagonal ends, and, as shown in FIG. 14, these hemi-octangle ends are defined based on the style (i.e., the eight delta values, $dx_{LO}$, $dy_{LO}$, $ds_{LO}$, $dt_{LO}$, $dx_{HI}$, $dy_{HI}$, $ds_{HI}$, and $dt_{HI}$) that is identified through the creation of the octagon 1305. As shown in FIG. 15, the overlap of segments 1405 and 1410 results in a smooth bend that does not have any notches or protrusions.

Figure 16:
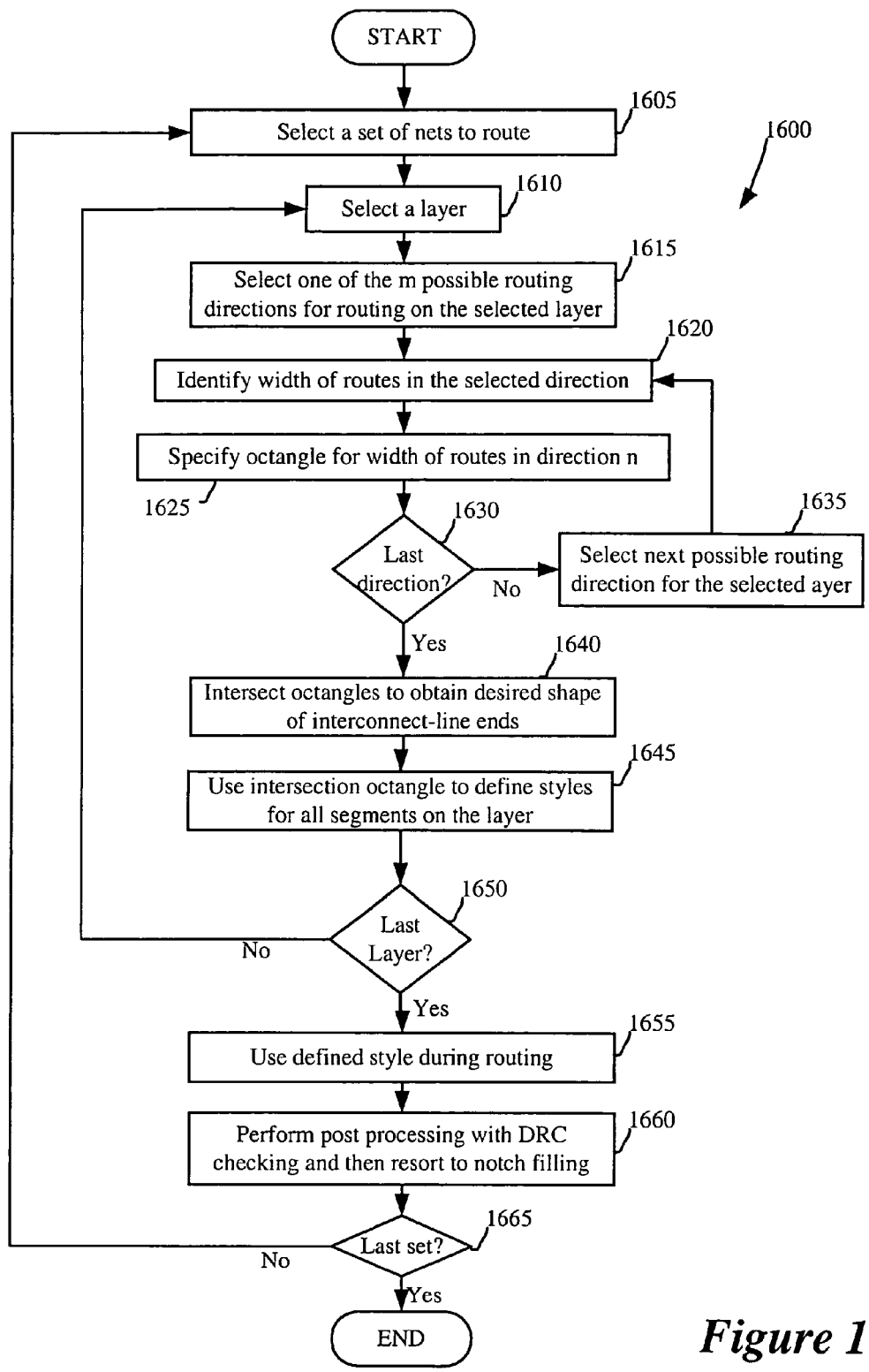
FIG. 16 illustrates a process that some embodiments use to define adaptively interconnect-line ends and route nets based on these ends.
Figure 19:
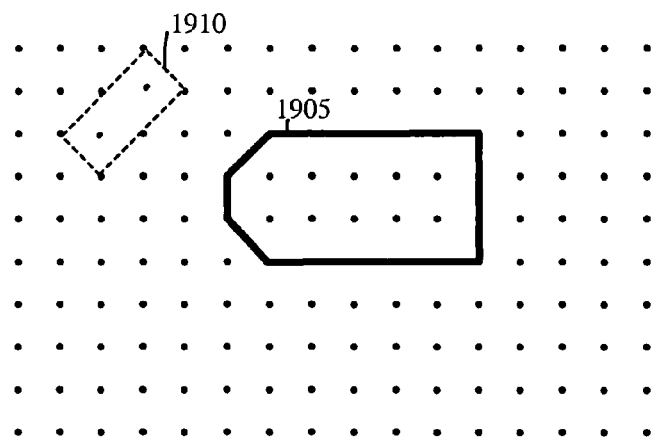
FIG. 19 illustrates a previously defined geometry on a particular wiring layer.

FIG. 16 illustrates a process 1600 that some embodiments use to define adaptively interconnect-line ends and route nets based on these ends. As further described below, this process routes one set of nets at a time. Each routed set includes only nets that have the same "metastyle." A metastyle specifies one style for each layer and one via type for each pair of adjacent layers, where a via type specifies the shapes associated with the pads and the cut of the via. In a metastyle, the styles can be the same or different on different layers. To define the shape of the interconnect-line ends on a particular layer, the process 1600 defines an octangle for each routing direction available on the particular layer, and then intersect the octangles to obtain another octangle, which the process 1600 then uses to refine the style for the routing directions on the particular layer (i.e., to refine the shape of the interconnect line ends along the routing directions on the particular layer).

As shown in FIG. 16, the process 1600 initially selects (at 1605) a set of nets to route. Every net in the selected set has the same metastyle, as described above. The process then selects (at 1610) a layer in the IC layout. In this layer, there are m routing directions available for the process 1600. Next, the process selects (at 1615) one of the m routing directions. In some embodiments, each layer has four available routing directions, which are the horizontal, vertical, and ±45° routing directions.

From the metastyle for the selected set of nets, the process then identifies (at 1620) the width W of route segments along the direction selected at 1615 on the layer selected at 1610. Based on this width, the process then defines (at 1625) an octangle data structure. This octangle data structure will include two values that equal to W/2 and −W/2 for the axis that is perpendicular to the selected direction, and six values that equal "infinity" (i.e., equal a very large number). For instance, if the selected routing direction is the 0° horizontal direction and the width of routes along this direction is 4, the octangle specifies $x_{LO}=\infty$, $y_{LO}=-2$, $s_{LO}=\infty$, $t_{LO}=\infty$, $x_{HI}=\infty$, $y_{HI}=2$, $s_{HI}=\infty$ $t_{HI}=\infty$.

Next, the process determines (at 1630) whether it has examined all the routing directions available on the layer selected at 1610. If not, the process selects (at 1635) another of the m routing directions that it has not yet selected for the layer selected at 1610. The process then identifies (at 1620) the width W of route segments along the direction selected at 1635 on the layer selected at 1610, and based on this width, it then defines (at 1620) an octangle data structure, as described above.

When the process determines (at 1630) that it has examined all the routing directions available on the selected layer, it intersects (at 1640) the octangles that it defined at 1625 for the routing directions available on the selected layer. The above-incorporated application Ser. No. 10/443,595 describes how a set of octangles can be intersected. The intersection of a set of octangles results in another octangle, which is referred to below as the intersection octangle.

At 1645, the process uses eight attributes of the intersection octangle to refine the style for the segment directions available on the layer selected at 1610. As mentioned above, in some embodiments, each layer has four routing directions, which are the horizontal, vertical, and ±45° routing directions. These four routing directions yield eight segment directions, 0°, 45°, 90°, 135°, 180°, 225°, 270°, and 315°. A route segment along each of segment direction can be defined in terms of a segment and a style. Accordingly, in some embodiments, the process uses (at 1645) the eight attributes of the intersection octangle identified at 1640 to redefine the style associated with the eight segment directions of the selected layer.

Next, the process determines (at 1650) whether it has examined all the layers of the IC layout. If not, the process returns to 1610 to select another layer. It then repeats its operations 1615-1645 for the newly selected layer in order to refine the style for the newly selected layer. When the process determines (at 1650) that it has examined all the layers of the IC layout, it then routes (at 1655) the set of nets by using the styles defined at 1645. This routing operation will be further described below in Section III. After 1655, the process then performs a post-processing operation to remove any undesirable bend shapes on each layer, whenever possible.

Undesirable bend shapes might occur at a 90° bend when one diagonal and two Manhattan routing directions are available on a layer. FIG. 17 illustrates an example of such an undesirable shape. Undesirable bend shapes might also occur at a 90° bend when one Manhattan direction and ±45° directions are available on a layer. FIG. 18 illustrates an example of such an undesirable shape.

Accordingly, the process 1600 performs the post-processing operation at 1655 to replace, whenever possible, such undesirable bend shape with perfectly 90° bends, which are illustrated in FIGS. 17 and 18. Before replacing an undesirable bend with a rectilinear bend, the process has to make sure that such a replacement will not result in a DRC violation. If the replacement would result in such a violation, the process might then have to define a new route for the affected net, or to flag the route so that an IC designer can later manually correct it.

After 1655, the process then determines (at 1665) whether it has routed all the sets of nets that it needs to route. If not, the process returns to 1605 to select another set of nets to route and then repeats the operations 1610-1660 for this newly selected set. When the process determines that it has routed all the sets of nets, it terminates. By adaptively defining the shape of interconnect line ends, the process 1600 reduces the number of bends along the routes that need to be modified.

III. Identifying Unroutable Regions and Routing

To facilitate the creation of routes with different widths and/or spacing in different directions on a particular layer, some embodiments define an "unroutable" bloated region about each previously defined geometry (e.g., each previously defined obstacle, wire, or via pad) for each potential route segment (i.e., each potential wire segment or via pad) that can neighbor the geometry. In other words, for each previously defined geometry that is on a particular layer, these embodiments define one bloated region about the geometry for each wire segment direction or via pad that can be placed on the particular layer. Similarly, for each previously defined via cut that is between two particular layers, these embodiments define one bloated region about the cut's geometry for each via cut that can neighbor the particular via cut.

These embodiments then use the bloated regions to figure out which portion of the layout is not available for routing. For instance, some of these embodiments perform one or more path searches to identify a route for a net. In these embodiments, a path search identifies a path from a source set of grid points to a target set of grid points by iteratively identifying path expansions, where each expansion is from a start grid point to a destination grid point. For each path expansion that goes from a particular start point to a particular destination point along a particular direction, these embodiments determine whether the destination point falls within the bloated region of the particular direction. If so, the destination point is not a valid destination point and the path expansion is not a valid expansion.

Figure 26:
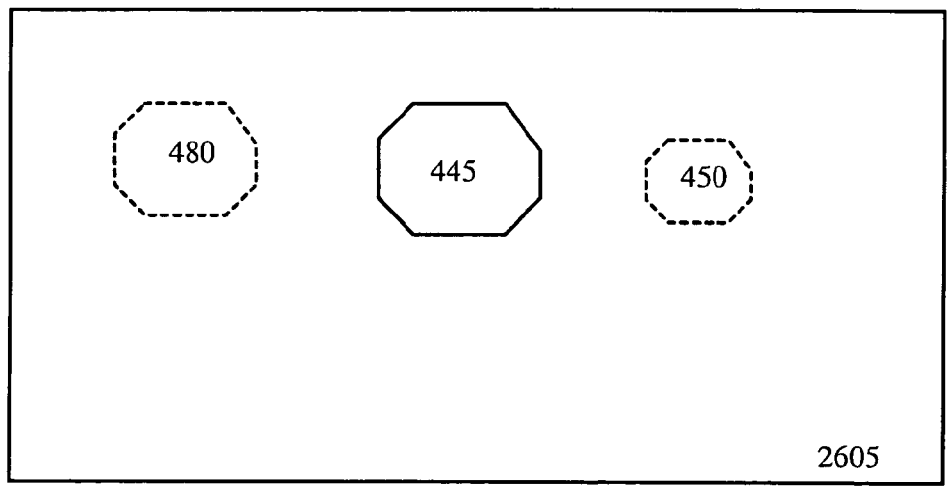
FIG. 26 illustrates how to compute a bloated region for a cut and a cut type.

Before describing further the use of the bloated regions during a path search, the process for defining the bloated regions will be first described below. FIGS. 19-25 illustrate several examples of defining a bloated region about a previously defined geometry 1905 on a particular wiring layer, while FIGS. 4 and 26 illustrate an example of defining a bloated region about a previously defined via cut.

A. Bloated Regions About Planar Geometries

The planar geometry in FIGS. 19-22 is the geometry 1905. This geometry might be an obstacle, a wire route segment of a previously defined route, or a via pad of a previously defined via. This obstacle is on a particular layer. Lets assume that this layer is the fourth layer. Lets also assume that the preferred direction on this layer is the 45° direction, but that horizontal, vertical, and ±45° directions are available for routing on this layer. Lets further assume that there are two types of via pads that can be placed on the fourth layer, one via pad for vias between the third and fourth layers and one via pad for vias between the fourth and fifth layers. Based on these assumptions, some embodiments would identify six bloated regions about the geometry 1905. These six bloated regions include two regions for the two via pad types. The regions would also include four regions for the four planar routing directions, i.e., one region for each of the four planar routing directions, which are the horizontal, vertical, and ±45° directions.

Figure 20:
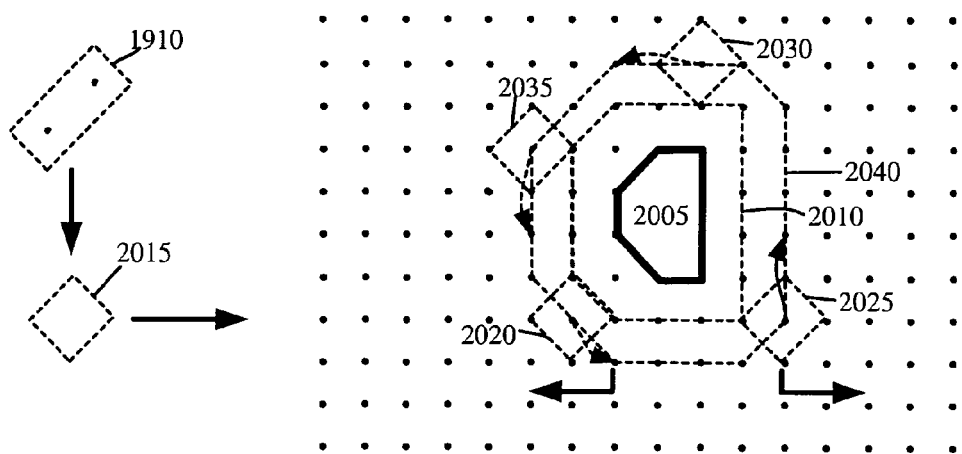
FIGS. 20-22 illustrate a search method for identifying a bloated region about the geometry of FIG. 19.
Figure 21:
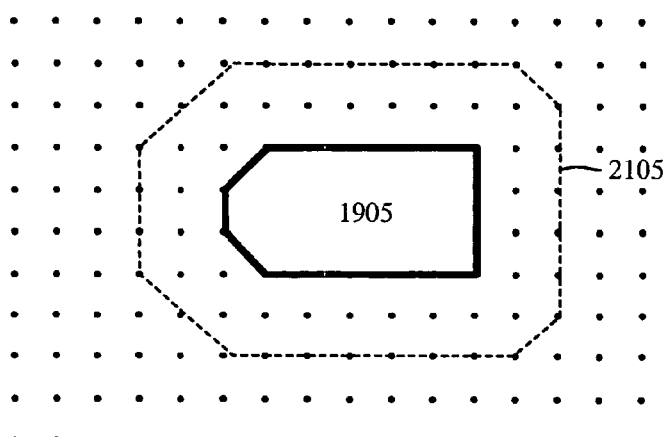
Figure 22:
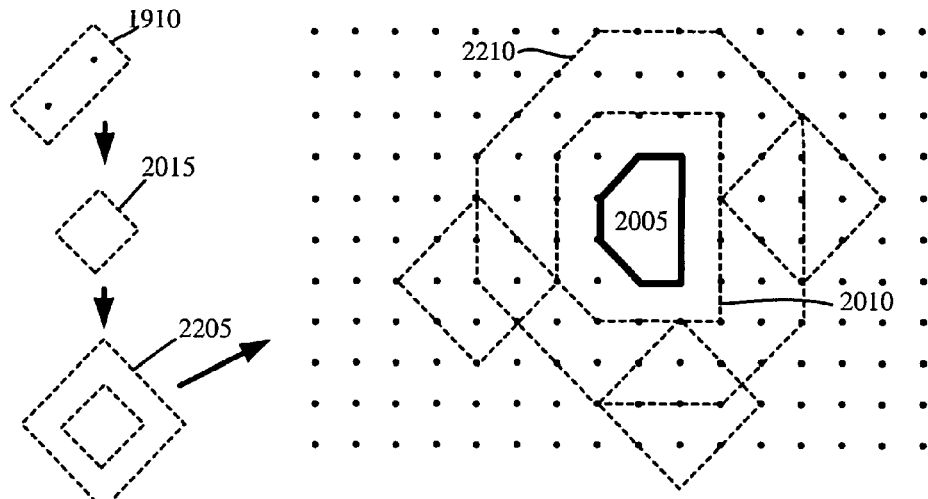

FIGS. 20-25 illustrate two ways for identifying a bloated region about the geometry 1905 for a potential route segment 1910. The first method is called a search method and is illustrated in FIGS. 20-22, while the second method is called the analytical method and is illustrated FIGS. 23-25. In the description of both these methods, the potential route segment is treated as a potential 45° route segment (i.e., a particular wire segment) on layer 4. However, the description would be equally applicable if the potential route segment was a via pad. Also, in the description below, the previously defined geometry is an obstacle or a wire segment (i.e., it is not a via pad). The description below is equally applicable for via pads, except that when the geometry 1905 is a via pad, the below-described search method does not shrink the via pad to obtain an elementary unit, in some embodiments.

1. Search Method.

FIG. 20 illustrates that the search method initially shrinks the geometry 1905 to an "elementary geometry unit" 2005, which is identical to the geometry 1905 except for its length. To identify the elementary geometry unit for a particular geometry, some embodiments identify the axis (the x-, y-, s-, or t-axis) along which the geometry's width is the longest. These embodiments then shrink the geometry along the identified axis as much as possible without eliminating any of the sides of the geometry, where each shrink operation goes from one grid point to another (i.e., redefines the endpoints of the sides of the polygon to go from one grid point to another). In the example illustrated in FIGS. 19 and 20, the x-axis is the axis along which the geometry 1905 has its largest width. Accordingly, the geometry 1905 is shrunk along the x-axis to obtain 2005. The hexagon 1905 cannot be shrunk to a smaller geometry than the hexagon 2005 because any additional shrinking will result in a four-sided polygon, which has two fewer sides than the hexagon 1905.

The search method shrinks the geometry 1905 in order to reduce the number of bloated regions that it needs to identify for different geometries. This advantage will be further described below after the description of FIG. 21. After identifying the elementary geometry unit 2005, the search method identifies an initial halo region 2010 about the unit geometry 2005. This halo region specifies the minimum spacing constraint about the elementary geometry unit 2005 for the 45°-direction wiring segment. The method then shrinks the potential route segment 1910 to an "elementary potential route unit" 2015, which is identical to the segment 1910 except for its length. An elementary potential route unit for a potential route segment is a route segment that is one manufacturing grid long in the direction of the potential route segment.

The method then places the elementary potential route unit 2015 at various grid points about the halo 2010 in order to identify the set of grids points that result in the intersection of the elementary potential route unit 2015 and the halo 2015. FIG. 20 illustrates four such positions 2020, 2025, 2030, and 2035. The identified set of points specify the boundary of the unroutable bloated region 2040 about the unit geometry 2005 for the 45° wiring direction. FIG. 20 illustrates that after identifying the unroutable bloated region 2040, the search method expands this region by the same proportion that it shrunk the geometry 1905 to obtain unit geometry 2005. As the shrinking operation in this example pushed in by 2 units the left and right sides of the geometry 1905, the expansion operation pushes out the left and right side of the bloated region 2040 by 2 units. This expansion results in the bloated region 2105, which is illustrated in FIG. 21.

Some embodiments mark the grid points on layer 4 that fall within or are in the boundary of the bloated region 2105 as "unroutable" for the 45° wiring direction. In other words, these embodiments mark the grid points on layer 4 that fall within or are in the boundary of the bloated region 2105 as points that are not viable destination points for expansions along the 45 direction on layer 4.

As mentioned above, the search method shrinks the geometry 1905 for which it is identifying the bloated region, in order to reduce the number of bloated regions that it needs to identify for different geometries. Specifically, when two geometries are similar except for their lengths, their bloated regions are the same except for their lengths, for the same wire segment direction or via-pad type. Accordingly, to identify the bloated region for a previously defined geometry and a potential route segment that might neighbor the geometry, the above-described search method shrinks the geometry to its elementary geometry unit. It then determines whether it has previously identified a bloated region about the elementary geometry unit and the potential route segment. If so, the method expands the previously identified bloated region by the same proportion that it shrunk the geometry to obtain the elementary geometry unit.

On the other hand, if the search method determines that it had not previously identified a bloated region about the elementary geometry unit and the potential route segment, it searches about the spacing halo around the elementary geometry unit to identify a bloated region about the elementary geometry unit. It then stores the bloated region for the elementary geometry unit. The method then expands the resulting bloated region by the same proportion used to shrink the original geometry, in order to obtain the bloated region for the original geometry.

Three further refinements to the search method should also be mentioned. First, to identify the bloated region for a previously defined geometry and a potential route segment that might neighbor the geometry, the search method even before shrinking the previously defined geometry, can check whether it has previously identified a bloated region for an identical geometry and an identical potential route segment on the same layer. If so, the search method can simply use the previously defined bloated region.

Second, the search method described above by reference to FIG. 20 identifies the bloated region by identifying potential candidate positions for the elementary potential route unit 2015 that result in the intersection of the halo region and the route unit 2015. In other embodiments, the search method might identify the bloated region slightly differently. Specifically, as shown in FIG. 22, these embodiments might bloat the elementary potential route unit 2015 by this wire segment's spacing constraint for the geometry 1905. This bloating results in a bloated route unit 2205. As further illustrated in FIG. 22, these embodiments might then identify a bloated region as region 2210 about the halo. The region 2210 is the region that specifies the potential candidate grid points for the elementary potential route unit 2015 that result in the intersection of the halo region 2010 about the elementary geometry unit 2005 and the halo region 2205 about the route unit 2015. The approach illustrated in FIG. 20 treats the spacing constraints about the geometries and route segments in an additive manner, while the approach illustrated in FIG. 22 treats the spacing constraints about the geometries and route segments additively.

Third, another variation of the search method that treats the spacing constraints about the geometries and route segments non-additively, is to perform the same operations illustrated in FIGS. 20 and 21 with the exception of the operation that defines the initial spacing-constraint halo about the geometry unit 2005. Instead of defining the halo region 2010 simply based on the minimum spacing constraint of the geometry unit 2005 for the 45° wire segment, some embodiments define this halo region as the maximum of (1) the halo region 2010 that can be obtained about the elementary geometry unit 2005 by applying this unit's minimum spacing constraint for the wire segment at issue (i.e., the 45-direction wiring in this example), and (2) the halo region that can be obtained about the elementary geometry unit 2005 by applying the wire segment's minimum spacing constraint for the geometry 2005. In other words, these embodiments identify two halo regions, one that is the above-described region 2010 and another that is the halo region that can be identified by identifying the wire segment's minimum spacing constraint for the geometry 2005 about the geometry 2005. These embodiments then identify the halo region about the geometry unit 2005 as the union of the two identified halo regions.

2. Analytical Method.

Figure 23:
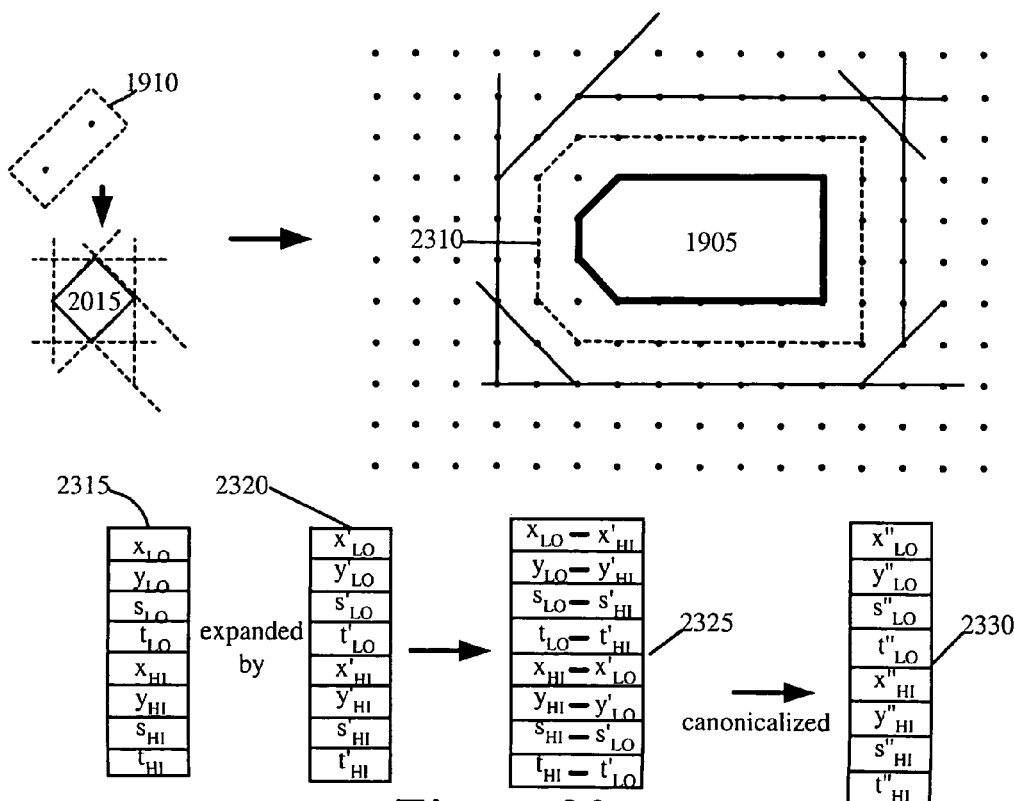
FIGS. 23-25 illustrate an analytical method for identifying a bloated region about the geometry of FIG. 19.
Figure 24:
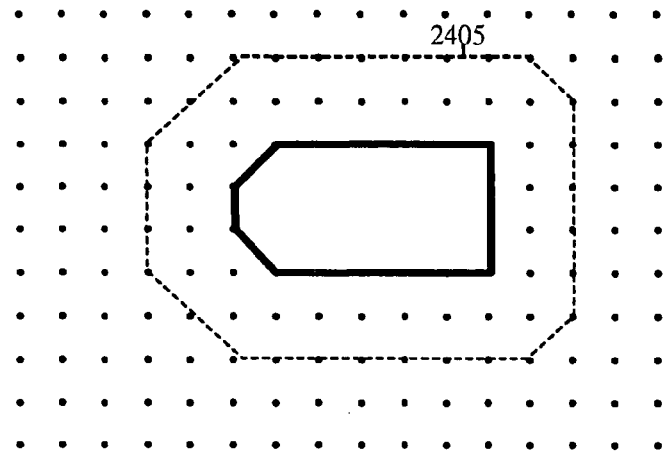
Figure 25:
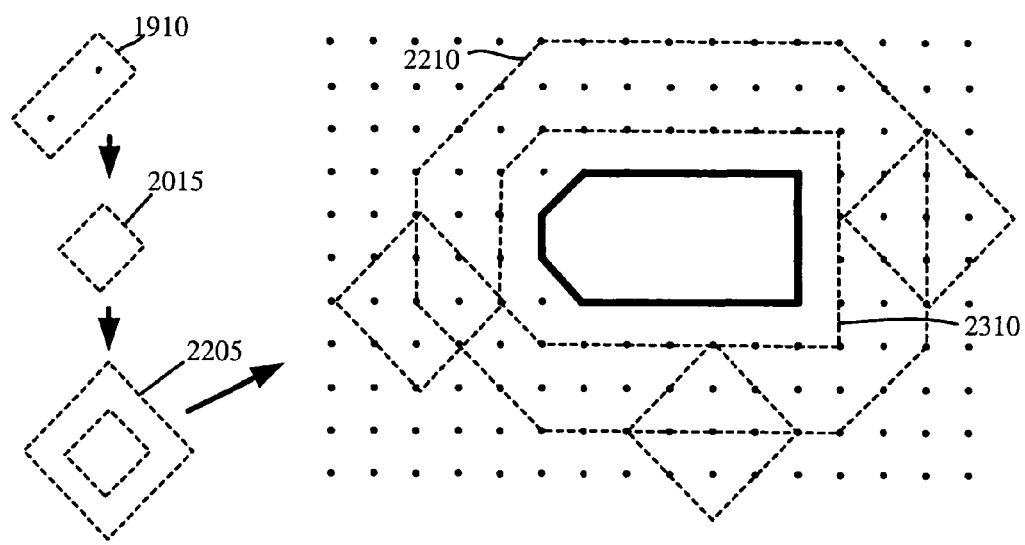

FIGS. 23-25 illustrate the analytical method for identifying the bloated region about the geometry 1905 for the potential route segment 1910. Some embodiments use this analytical method when each item in the layout can be represented in terms of one octangle, or can be broken into series of convex polygons, each of which, in turn, can be represented in terms of an octangle.

FIG. 23 illustrates that the analytical method initially shrinks the potential route segment 1910 to an "elementary potential route unit" 2015, which is identical to the segment 1910 except for its length. As mentioned above, the elementary potential route unit 2015 for a potential route segment is a route segment that is one manufacturing grid wide in the direction of the potential route segment. An octangle data structure 2320 can be used to represent the elementary potential route unit 2015. This data structure specifies eight half-plane values.

As shown in FIG. 23, the analytical method identifies an initial halo region 2310 about the geometry 1905. This halo region specifies the minimum spacing constraint about the geometry 1905 for the 45°-direction wire segment. The analytical method then uses the eight half-plane values that define the elementary potential route unit 2015 to expand the halo region 2310. The halo region is represented in terms of an octangle 2315. Hence, as illustrated in FIG. 23, the analytical method expands the halo region 2310 by (1) subtracting the high values of the octangle 2320 of the elementary potential route unit 2015 from the corresponding low values of the octangle 2315 of the geometry 1905, and (2) subtracting the low values of the octangle 2320 of the elementary potential route unit 2015 from the corresponding high values of the octangle 2315 of the geometry 1905. These subtraction operations yields a third octangle 2325. The analytical method then canonicalizing the values of the third octangle to obtain a fourth octangle 2330.

The fourth octangle 2330 defines the bloated region 2405, which is illustrated in FIG. 24. The bloated region 2405 is the region that contains the potential candidate positions for the elementary potential route unit 2015 that result in the intersection of the halo region 2310 and the route unit 2015.

Some embodiments mark the grid points on layer 4 that fall within or are in the boundary of the bloated region 2405 as "unroutable" for the 45° wiring direction. In other words, these embodiments mark the grid points on layer 4 that fall within or are in the boundary of the bloated region 2405 as points that are not viable destination points for expansions along the 45 direction on layer 4.

In other embodiments, the analytical method might identify the bloated region slightly differently. For instance, as shown in FIG. 25, these embodiments might bloat the elementary potential route unit 2015 by this wire segment's spacing constraint for the geometry 1905. This bloating results in a bloated route unit 2205. These embodiments then expand the halo region 2310 by the octangle of the bloated route unit. As further illustrated in FIG. 25, this expansion results in a region 2210. The region 2210 is the region that specifies the potential candidate grid points for the elementary potential route unit 2015 that result in the intersection of the halo region 2310 about the geometry 1905 and the halo region 2205 about the route unit 2015. The approach illustrated in FIG. 23 treats the spacing constraints about the geometries and route segments in a non-additive manner, while the approach illustrated in FIG. 25 treats the spacing constraints about the geometries and route segments in an additive manner.

Also, like the search method, there exists another variation of the analytical method that treats the spacing constraints about the geometries and route segments non-additively. This variation performs the same operations illustrated in FIG. 23 with the exception of the operation that defines the initial spacing-constraint halo about the geometry 1905. Instead of defining the halo region 2310 simply based on the minimum spacing constraint of the geometry unit 1905 for the 45°-wire segment, some embodiments define this halo region as the maximum of (1) the halo region 2310 that can be obtained about the elementary geometry unit 1905 by applying this unit's minimum spacing constraint for the wire segment at issue (i.e., the 45-direction wiring in this example), and (2) the halo region that can be obtained about the elementary geometry unit 1905 by applying the wire segment's minimum spacing constraint for the geometry 1905. In other words, these embodiments identify two halo regions, one that is the above-described region 2310 and another that is the halo region that can be identified by identifying the wire segment's minimum spacing constraint for the geometry 1905 about the geometry 1905. These embodiments then identify the halo region about the geometry unit 1905 as the union of the two identified halo regions.

The analytical method works seamlessly with gridless routers. This is because the regions identified by this method are derived mathematically without the need for searching a finite set of points about any item in the layout.

Also, for each particular geometry on each particular layer, some embodiments (1) use either the search or analytical method to identify the bloated regions for the particular geometry, (2) identify the union of all the identified bloated regions for the particular geometry, and then (3) mark the grid points that fall within the identified union as points that are not routable for any direction on the particular layers. This approach does not optimally use the routing resources but reduces the amount of memory used by the router.

B. Bloated Regions About Non-Planar Geometries

Via cuts are non-planar geometries. As mentioned above, each via is defined in terms of two pads on two layers traversed by the via, and a cut connecting the two pads. FIG. 4 illustrates three vias, a first via 405 that is between wiring layers 3 and 4, a second via 410 that is between wiring layers 4 and 5, and a third via 460 that is between wiring layers 3 and 4. Via 405 has pad 415 on layer 3, pad 420 on layer 4, and cut 425 between layers 3 and 4. Via 410 has pad 430 on layer 4, pad 435 on layer 5, and cut 440 between layers 4 and 5. Via 460 has pad 470 layer 3, pad 465 on layer 4, and cut 475 between layers 3 and 4.

The above-described search and analytical methods can be used to define bloated regions about previously defined geometries, which includes via pads on particular wiring layers. Some embodiments also identify one other type of bloated regions. These are bloated region about the cuts associated with the vias.

For instance, in FIG. 4, the via 405 might be a previously defined via, while via 410 is a potential route segment that might neighbor via 405. To account for this neighbor, some embodiments compute a bloated region for the pad 420 and the via-pad type 430, and this bloated region is used to mark the grid for layer 4 (i.e., to identify unroutable grid points for vias to layer 4 from layer 5). The computation of this bloated region is described above in the previous Section III.A.

In addition, some embodiments compute a bloated region for the cut 425 and the cut type 440. FIG. 26 illustrates how to compute the bloated region for the cut 425 and the cut type 440. Each of these cuts has a cross section associated with it. As shown FIG. 4, these cross sections are convex polygons 445 and 450, which can be defined in terms of two octangles. These two convex polygons are projected onto a plane 2605, so that the cuts can be treated as two planar geometric shapes. Once these two polygons are projected onto the plane 2605, the bloated region about the convex polygon 445 (which is associated with the previously defined cut 425) for the convex polygon 450 (which is associated with the potential neighboring cut 440) can be easily identified by simply using the search or analytical method described above. When using the search method, some embodiments do not shrink the via pad geometries. Once the bloated region is identified, the grid points that are not routable in the via cut planes between layers 4 and 5 are marked, in order to identify the portion of the cut planes that are not available for defining vias between layers 4 and 5 in the vicinity of the via 405.

FIG. 4 illustrates another via 460 between layers 3 and 4. Via 460 includes pads 465 and 470, and cut 475. Like via 410, via 460 is a potential route segment that might neighbor via 405. To account for this neighbor, a bloated region for the pad 420 and the via-pad type 465 also needs to be computed. To account for this neighbor, some embodiments compute a bloated region for the pad 420 and the via-pad type 465, and this bloated region is used to mark the grid for layer 4 (i.e., to identify unroutable grid points for vias to layer 4 from layer 3). The computation of this bloated region is described above in the previous Section III.A.

Also, a bloated region for the cut 425 and the cut type 475 also needs to be computed. FIG. 26 illustrates how to compute the bloated region for the cut 425 and the cut type 475. As shown FIG. 4, the cross section of via 460 is convex polygon 480, which can be defined in terms of an octangle. The two convex polygons 445 and 480 of the cuts 425 and 440 are projected onto a plane 2605, so that the cuts can be treated as two planar geometric shapes. Once these two polygons are projected onto the plane 2605, the bloated region about the convex polygon 445 (which is associated with the previously defined cut 425) for the convex polygon 480 (which is associated with the potential neighboring cut 475) can be easily identified by simply using the search or analytical method described above. Once the bloated region is identified, the grid points that are not routable in the via cut planes between layers 3 and 4 are marked, in order to identify the portion of the cut planes that are not available for defining vias between layers 3 and 4 in the vicinity of the via 405.

Some embodiments pretabulate bloated regions for all combinations of geometries and potential planar and non-planar route segments adjacent to the geometries. These embodiments pretabulate these regions in order to improve the run-time performance of the router (i.e., to reduce the time the router has to identify unroutable regions next to previously defined geometries in the layout).

C. Route Generation

Figure 27:
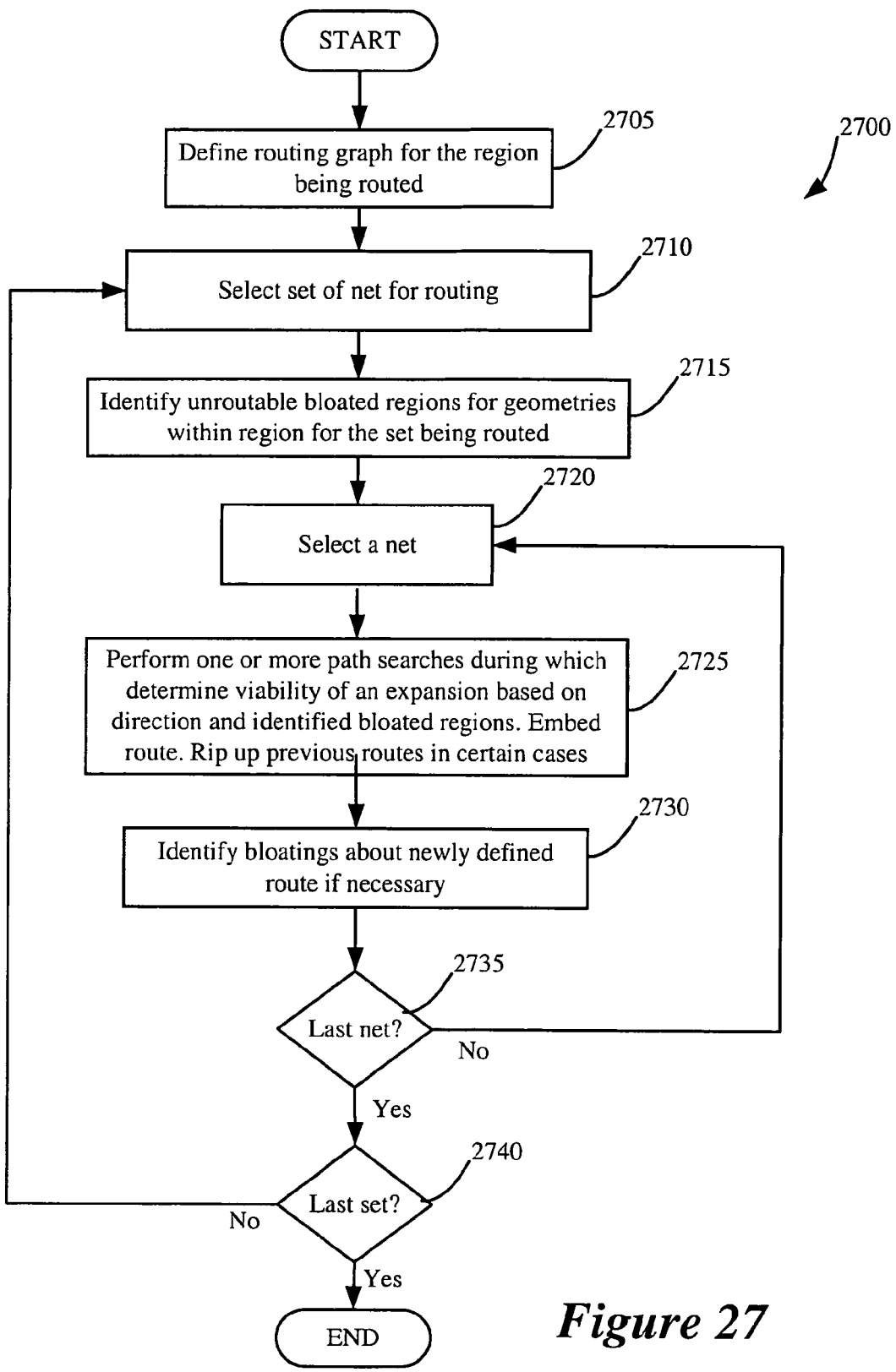
FIG. 27 illustrates the overall flow of a router that uses the above-described bloating techniques.

FIG. 27 illustrates the overall flow of a router that uses the above-described bloating techniques. As shown in this figure, the router initially defines (at 2705) a routing graph for the region being routed. In some embodiments, the routing graph includes (1) a routing grid for each wiring layer and (2) two cut-plane grids for the vias between each pair of adjacent layers. The above-described FIG. 3 illustrates examples of five routing grids for the five wiring layers of FIG. 1, while the above-described FIG. 5 illustrates an example of two cut planes for vias between the fourth and fifth wiring layer of the wiring model illustrated in FIG. 1.

The process then selects (at 2710) a set of nets for routing. In some embodiments, the selected set of nets are nets that have the same metastyle. As mentioned above, a metastyle specifies one style for each layer and one via style for each pair of adjacent layers. After 2710, the process then identifies (at 2715) an "unroutable" bloated region about each previously defined geometry (e.g., an obstacle, wire, or via pad) for each potential route segment (i.e., each potential wire segment or via pad) that can neighbor the geometry. For each previously defined via cut that is between two particular layers, the process also defines (at 2715) one bloated region about the cut's geometry for each via cut that can neighbor the particular via cut. The process defines the bloated regions at 2715 by using the approaches described above in Section III.A and B. As mentioned above, some embodiments use the defined bloated regions to mark unroutable grid points (for different wire directions and via types) in the layer grids and cut planes of the routing graph.

The process next selects (at 2720) a net to route. It then performs (at 2725) one or more path searches to identify a route for the net, where each path search result connects two pins of the net or connects a pin of the net to a previously defined segment of the route. After each successful path search (i.e., each path search that reaches a target grid point from a start grid point), the process in some embodiments performs a back-trace operation that defines a route portion that traces the set of expansions that connected the start and target grid points.

The path search and/or embedding operations might in some embodiments result in the rip-up of routes defined previously for previously routed nets. When the process rips out a previously defined route for a particular net, the process adds the particular net to the group of nets that it needs to route, and then later re-routes this net. As further described below in Section III.D, each path search uses the bloated regions defined at 2715 and 2730 and/or the unroutable markings defined at 2715 and 2730 to figure out viability of path expansions that it identifies. This viability determination will be further described below.

After 2725, the routing process 2700 (at 2730) identifies, if necessary, an "unroutable" bloated region about each geometry of the just defined route (i.e., the route defined in the last iteration through 2725) for each potential route segment (i.e., each potential wire segment or via pad) that can neighbor the geometry. For each via cut of the just defined route, the process (at 2730) also defines, if necessary, one bloated region about the cut's geometry for each via cut that can neighbor the particular via cut. The process defines the bloated regions at 2730 by using the approaches described above in Section III.A and B.

After 2730, the process determines (at 2735) whether it has examined all the nets in the set selected at 2710. If not, the process returns to 2720 to select another net, and repeats the operations 2725 and 2730 for this net. Otherwise, the process determines (at 2740) whether it has defined routes for all the sets of nets that it needs to route. If not, the process returns to 2710 to select another set of nets to route, and then repeats 2715-2735 for this set of nets. When the process determines (at 2740) that it has examined all the sets of nets, the process terminates.

D. Path Search

As mentioned above, each path search that the routing process 2700 performs uses the bloated regions defined at 2715 and at 2730 to figure out viability of path expansions that it identifies. Specifically, the routing process 2700 might use one of many different path search techniques (such as line search, maze search, A*, etc.) to identify one set of expansions that connect source and target grid points that are defined for each path search. In identifying a set of expansions that connect source and target grid points for a path search, a path search process typically explores numerous path expansions. Exploring a path expansion, which starts at a particular grid point (called a start point) and goes to a particular grid point (called a destination point), often entails (1) identifying the potential for the expansion, (2) determining the viability of the path expansion, and when the expansion is viable, (3) costing the expansion.

Figure 28:
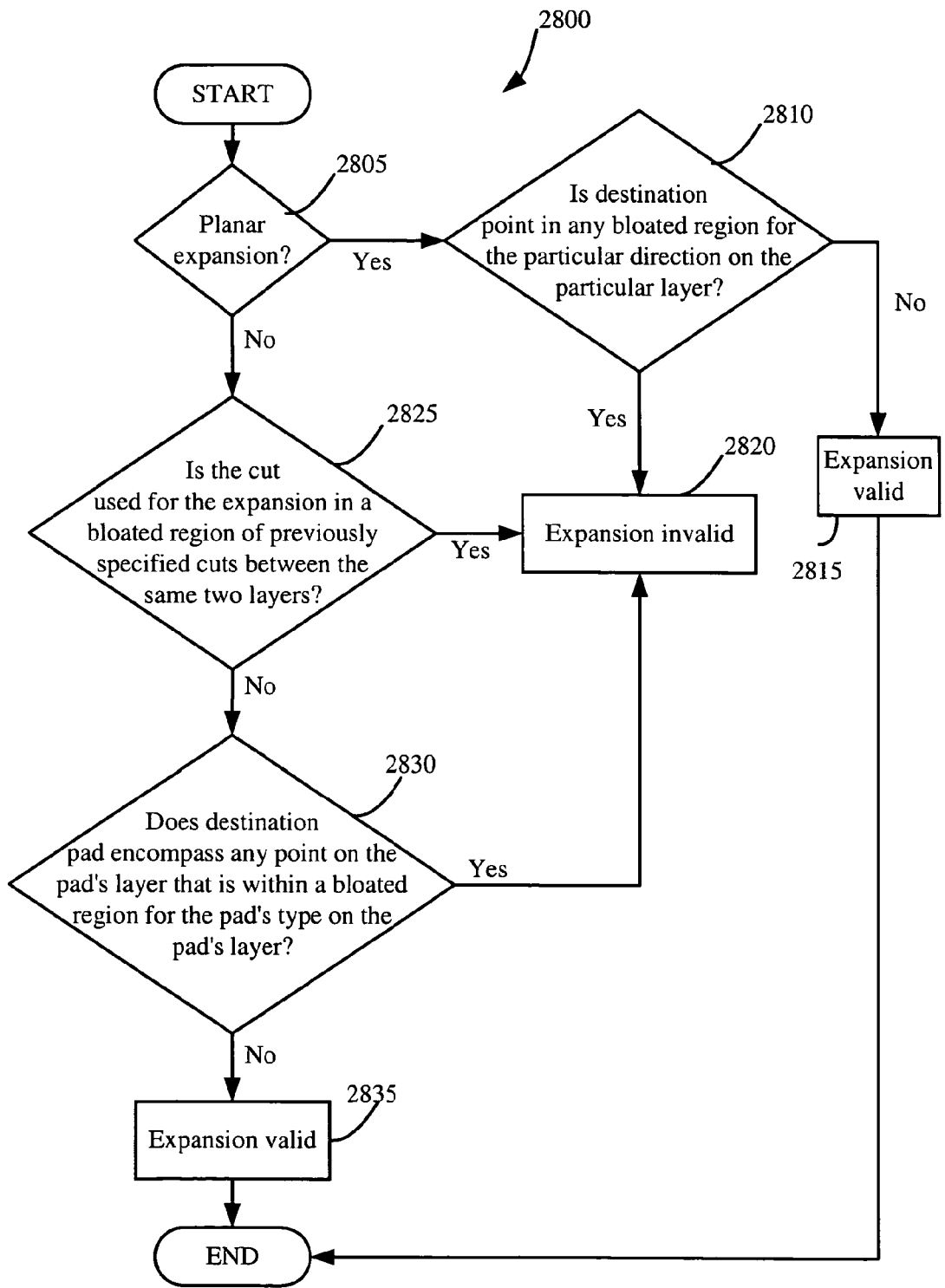
FIG. 28 illustrates a process that the path search of the routing process of FIG. 27 uses to determine the viability of an identified potential path expansion along a particular direction from a start point to a destination point.

The bloated regions defined at 2715 and 2730 can be used to determine the viability of a path expansion. FIG. 28 illustrates a process 2800 that the path search of the routing process 2700 uses to determine the viability of an identified potential path expansion along a particular direction from a start point to a destination point. As shown in this figure, the process 2800 initially determines (at 2805) whether the expansion is a planar expansion. If so, the process determines (at 2810) whether the destination point of the potential expansion is within the bloated region for the particular direction on the particular layer (e.g., whether the destination point of the potential expansion has been marked unroutable for the direction of the expansion on the particular layer). If not, the process 2800 specifies (at 2815) the expansion as a viable one, and then ends. If so, the process specifies (at 2820) the expansion as a non-viable expansion and then ends.

When the process determines (at 2805) that the expansion is not a planar expansion (i.e., it determines that the identified expansion has a start point that is on one layer and a destination point that is on another layer), the process transitions to 2825. At 2825, the process determines whether the via cut that needs to be used for the identified expansion is within the bloated region of a previously specified via cut between the same two layers traversed by the identified expansion. To make this determination, the process determines whether the expansion's cut falls within a bloated region (i.e., whether the expansion's cut encompasses any grid points marked unroutable) in the cut planes for the same two layers traversed by the identified expansion.

If the process determines (at 2825) that the cut is within another cuts bloated region, it specifies (at 2820) the expansion as a non-viable expansion, and then ends. Otherwise, the process determines (at 2830) whether the via pad that contains the destination point of the identified expansion encompass any point on the pad's layer that is within the bloated region for the pad's type on the pad's layer (e.g., whether the via pad containing the destination point of the potential expansion encompasses any point on the pad's layer that has been marked unroutable for the pad's type on the pad's layer). If so, the process specifies (at 2820) the expansion as a non-viable expansion, and then ends. Otherwise, the process specifies (at 2835) the expansion as a viable expansion, and then ends.

Figure 29:
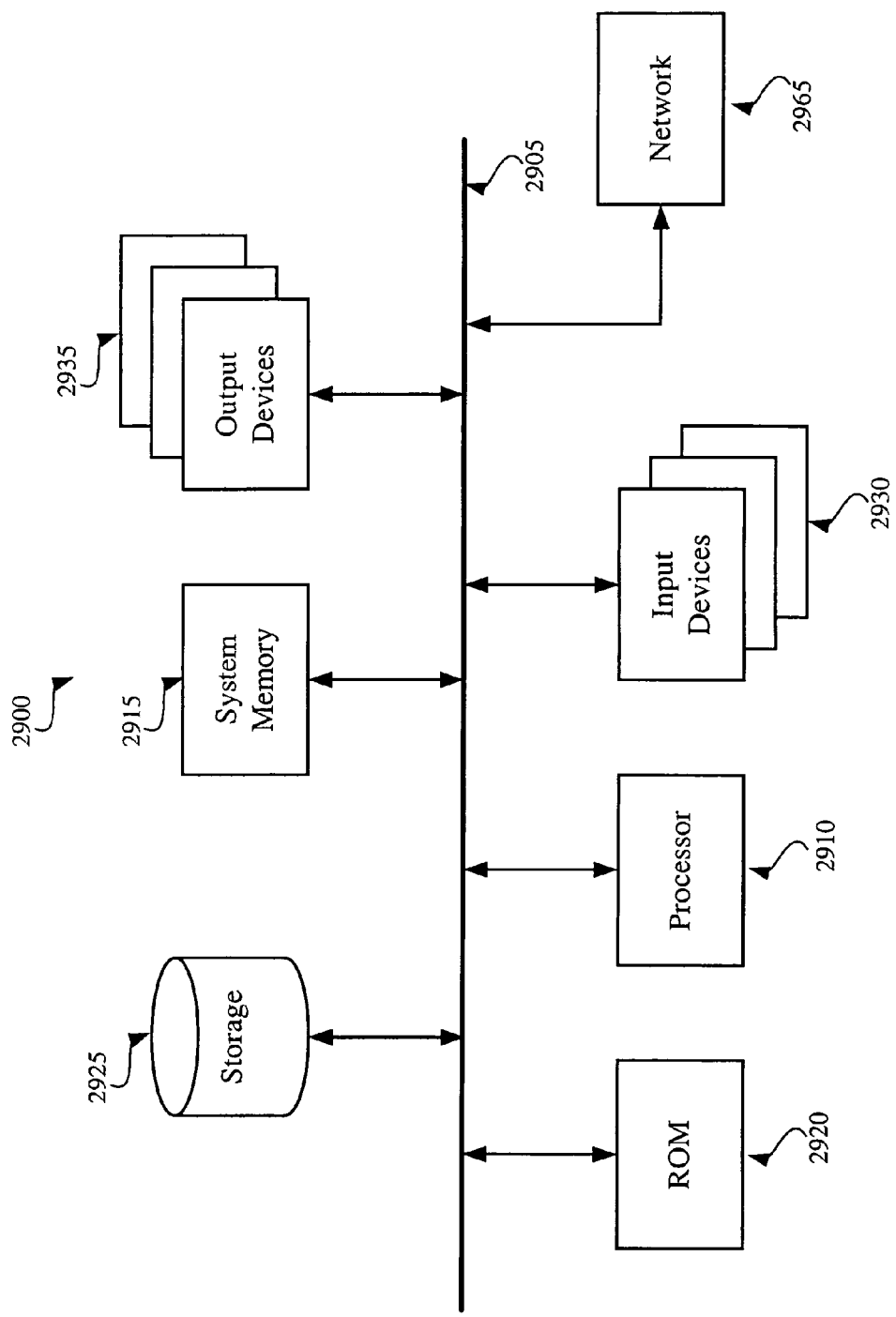
FIG. 29 conceptually illustrates a computer system with which one embodiment of the invention is implemented.

FIG. 29 conceptually illustrates a computer system with which one embodiment of the invention is implemented. Computer system 2900 includes a bus 2905, a processor 2910, a system memory 2915, a read-only memory 2920, a permanent storage device 2925, input devices 2930, and output devices 3035.

The bus 2905 collectively represents all system, peripheral, and chipset buses that support communication among internal devices of the computer system 2900. For instance, the bus 2905 communicatively connects the processor 2910 with the read-only memory 2920, the system memory 2915, and the permanent storage device 2925.

From these various memory units, the processor 2910 retrieves instructions to execute and data to process in order to execute the processes of the invention. The read-only-memory (ROM) 2920 stores static data and instructions that are needed by the processor 2910 and other modules of the computer system. The permanent storage device 2925, on the other hand, is a read-and-write memory device. This device is a non-volatile memory unit that stores instruction and data even when the computer system 2900 is off. Some embodiments of the invention use a mass-storage device (such as a magnetic or optical disk and its corresponding disk drive) as the permanent storage device 2925. Other embodiments use a removable storage device (such as a floppy disk or Zip® disk, and its corresponding disk drive) as the permanent storage device.

Like the permanent storage device 2925, the system memory 2915 is a read-and-write memory device. However, unlike storage device 2925, the system memory is a volatile read-and-write memory, such as a random access memory. The system memory stores some of the instructions and data that the processor needs at runtime. In some embodiments, the invention's processes are stored in the system memory 2915, the permanent storage device 2925, and/or the read-only memory 2920.

The bus 2905 also connects to the input and output devices 2930 and 2935. The input devices enable the user to communicate information and select commands to the computer system. The input devices 2930 include alphanumeric keyboards and cursor-controllers. The output devices 2935 display images generated by the computer system. For instance, these devices display IC design layouts. The output devices include printers and display devices, such as cathode ray tubes (CRT) or liquid crystal displays (LCD).

Finally, as shown in FIG. 29, bus 2905 also couples computer 2900 to a network 2965 through a network adapter (not shown). In this manner, the computer can be a part of a network of computers (such as a local area network ("LAN"), a wide area network ("WAN"), or an Intranet) or a network of networks (such as the Internet). Any or all of the components of computer system 2900 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. For instance, although several embodiments of the invention were described for a detailed router, one of ordinary skill will realized that these embodiments can also be implemented for global routers. Thus, one of ordinary skill in the art would understand that the invention is not to be limited by the foregoing illustrative details, but rather is to be defined by the appended claims.

We claim:

1. A method of defining a route for a net in a design layout that has multiple routing layers, wherein a set of at least two routing directions are available for routes on a particular routing layer, the method comprising:
   a) before identifying a route for the net, adaptively defining a shape based on the set of routing directions available on the particular routing layer;
   b) for the net, identifying the route comprising a plurality of segments; and
   c) based on attributes of the adaptively defined shape, defining a shape for each segment in order to allow intersecting ends of said segments to properly overlap, wherein the defining of the route is done on a computer.

2. The method of claim 1, wherein adaptively defining the shape comprises adaptively defining the shape based on required widths for the route along different routing directions available on the particular routing layer.

3. The method of claim 2, wherein adaptively defining the shape based on the required widths for the route comprises:
   defining at least two half planes based on each required width for the route along each available routing direction; and
   intersecting the half planes, wherein the intersection of the half planes defines the shape.

4. The method of claim 3, wherein defining the half planes comprises defining a data structure that defines each particular half plane by specifying one particular value.

5. The method of claim 3, wherein each segment of the route has an associated style that defines the shape of the segment, wherein the defined shape is used to define the associated style of the route segments.

6. The method of claim 1 further comprising:
   a) for each specific routing layer of the design layout, adaptively defining a specific shape based on the set of routing directions available on the specific routing layer;
   b) for each specific routing layer of the design layout, using the defined specific shape to define a specific shape at ends of segments of the route on the specific routing layer; and
   c) using the route segments with the defined shapes to define the route.

7. The method of claim 6, wherein the method routes one set of nets at a time, the method further comprising:
   for each particular set of nets:
   a) adaptively defining, for each specific routing layer of the design layout, a specific shape based on the set of routing directions available on the specific routing layer;

b) using the defined specific shape for each specific routing layer of the design layout to define the specific shape at the ends of segments of the route on the specific routing layer; and c) using the route segments with the defined shapes to define the route.

8. The method of claim 1, wherein the design layout is an integrated circuit layout.

9. The method of claim 1, wherein the routing directions include Manhattan directions.

10. The method of claim 1, wherein the routing directions include Manhattan and non-Manhattan directions.

11. The method of claim 1, wherein the intersecting ends of said segments properly overlap when the intersection does not create a protrusion or a notch.

12. The method of claim 1 further comprising receiving several nets for routing before adaptively defining the shape based on the set of routing directions available on the particular routing layer.

13. A computer readable medium that stores a computer program which when executed by a processor defines a route for a net in a design layout that has multiple routing layers, wherein a set of at least two routing directions are available for routes on a particular routing layer, the computer program comprising sets of instructions for:

a) before identifying a route for the net, adaptively defining a shape based on the set of routing directions available on the particular routing layer;

b) for the net, identifying the route comprising a plurality of segments; and c) based on attributes of the adaptively defined shape, defining a shape for the ends of each segment in order to allow intersecting ends of said segments to properly overlap.

14. The computer readable medium of claim 13, wherein the set of instructions for adaptively defining the shape comprises a set of instructions for adaptively defining the shape based on required widths for the route along different routing directions available on the particular routing layer.

15. The computer readable medium of claim 14, wherein the set of instructions for adaptively defining the shape based on the required widths for the route comprises sets of instructions for:

defining at least two half planes based on each required width for the route along each available routing direction; and intersecting the half planes, wherein the intersection of the half planes defines the shape.

16. The computer readable medium of claim 15, wherein the set of instructions for defining the half planes comprises a set of instructions for defining a data structure that defines each particular half plane by specifying one particular value.

17. The computer readable medium of claim 15, wherein each segment of the route has an associated style that defines the shape of the segment, wherein the defined shape is used to define the associated style of the route segments.

18. The computer readable medium of claim 13, wherein the computer program further comprises sets of instructions for:

a) adaptively defining, for each specific routing layer of the design layout, a specific shape based on the set of routing directions available on the specific routing layer;

b) using the defined specific shape for each specific routing layer of the design layout to define a specific shape at ends of segments of the route on the specific routing layer; and c) using the route segments with the defined shapes to define the route.

19. The computer readable medium of claim 18, wherein the computer program routes one set of nets at a time, wherein the computer program includes sets of instructions that for each particular set of nets:

a) adaptively define, for each specific routing layer of the design layout, a specific shape based on the set of routing directions available on the specific routing layer;

b) use the defined specific shape for each specific routing layer of the design layout to define the specific shape at the ends of segments of the route on the specific routing layer; and c) use the route segments with the defined shapes to define the route.

20. The computer readable medium of claim 13, wherein the layout is an integrated circuit layout.

21. The computer readable medium of claim 13, wherein the routing directions include Manhattan directions.

22. The computer readable medium of claim 13, wherein the routing directions include Manhattan and non-Manhattan directions.

23. A system comprising:

at least one processor for executing sets of instructions; and a memory for storing a computer program for defining a route for a net in a design layout that has multiple routing layers, wherein a set of at least two routing directions are available for routes on a particular routing layer, the computer program comprising sets of instructions for:

before identifying a route for the net, adaptively defining a shape based on the set of routing directions available on the particular routing layer;

for the net, identifying the route comprising a plurality of segments; and based on attributes of the adaptively defined shape, defining a shape for ends of each segment in order to allow intersecting ends of said segments to properly overlap.

24. The system of claim 23, wherein the set of instructions for adaptively defining the shape comprises a set of instructions for adaptively defining the shape based on required widths for the route along different routing directions available on the particular routing layer.

25. The system of claim 24, wherein the set of instructions for adaptively defining the shape based on the required widths for the route comprises sets of instructions for:

defining at least two half planes based on each required width for the route along each available routing direction; and intersecting the half planes, wherein the intersection of the half planes defines the shape.

26. The system of claim 25, wherein each segment of the route has an associated style that defines the shape of the segment, wherein the defined shape is used to define the associated style of the route segments.

* * * * *